US011203094B2

(12) United States Patent
Murachi et al.

(10) Patent No.: US 11,203,094 B2
(45) Date of Patent: Dec. 21, 2021

(54) SUBSTRATE CLEANING DEVICE, SUBSTRATE PROCESSING APPARATUS, SUBSTRATE CLEANING METHOD AND SUBSTRATE PROCESSING METHOD

(71) Applicant: SCREEN HOLDINGS CO., LTD., Kyoto (JP)

(72) Inventors: Hiromi Murachi, Kyoto (JP); Ryuichi Yoshida, Kyoto (JP); Koji Nishiyama, Kyoto (JP); Toru Momma, Kyoto (JP); Chikara Sagae, Kyoto (JP)

(73) Assignee: SCREEN Holdings Co., Ltd.

( * ) Notice: Subject to any disclaimer, the term of this patent is extended or adjusted under 35 U.S.C. 154(b) by 74 days.

(21) Appl. No.: 16/840,520

(22) Filed: Apr. 6, 2020

(65) Prior Publication Data

US 2020/0230778 A1 Jul. 23, 2020

Related U.S. Application Data

(62) Division of application No. 15/697,727, filed on Sep. 7, 2017, now abandoned.

(30) Foreign Application Priority Data

Sep. 13, 2016 (JP) ................................ 2016-178817

(51) Int. Cl.

*H01L 21/02* (2006.01)
*B24B 29/02* (2006.01)
(Continued)

(52) U.S. Cl.

CPC .............. *B24B 29/02* (2013.01); *B08B 1/002* (2013.01); *B08B 1/02* (2013.01); *B08B 3/022* (2013.01); *B08B 7/04* (2013.01); *B08B 11/02* (2013.01)

(58) Field of Classification Search

CPC ....... B24B 29/02; B24B 37/04; B24B 37/042; B24B 37/07; B24B 37/105; B24B 37/107;
(Continued)

(56) References Cited

U.S. PATENT DOCUMENTS 6,059,891 A 5/2000 Kubota et al. .................. 134/18
6,106,369 A 8/2000 Konishi et al. ................. 451/11
(Continued)

FOREIGN PATENT DOCUMENTS

CN 101436564 A 5/2009
CN 105500181 A 4/2016
(Continued)

*Primary Examiner* — David G Cormier
(74) *Attorney, Agent, or Firm* — Ostrolenk Faber LLP

(57) ABSTRACT

In a substrate cleaning device, with a polishing head in contact with one surface of a substrate rotated by a spin chuck, the polishing head is moved at least between a center and an outer periphery of the substrate. Thus, the one surface of the substrate is polished by the polishing head, and contaminants present on the one surface of the substrate are removed. At this time, capacity for removing contaminants by the polishing head is changed according to a position in a radial direction of the substrate. The capacity for removing contaminants refers to capacity for scraping contaminants adhering to the one surface of the substrate, and suction marks, contact marks and the like remaining on the one surface of the substrate by polishing. It is possible to change the capacity for removing contaminants by adjusting a pushing force exerted on the one surface of the substrate from the polishing head, for example.

10 Claims, 18 Drawing Sheets

(51) Int. Cl.

| | |
|---|---|
| ***B08B 11/02*** | (2006.01) |
| ***B08B 3/02*** | (2006.01) |
| ***B08B 1/02*** | (2006.01) |
| ***B08B 1/00*** | (2006.01) |
| ***B08B 7/04*** | (2006.01) |

(58) Field of Classification Search

CPC ......... B24B 41/047; B08B 7/04; B08B 1/002; B08B 1/008; H01L 21/02013; H01L 21/02016; H01L 21/02024; H01L 21/02041; H01L 21/02043; H01L 21/02052; H01L 21/02054; H01L 21/02057; H01L 21/0209; H01L 21/02096; H01L 21/67046; H01L 21/67092; H01L 21/67155; H01L 21/67219; H01L 21/302; H01L 21/304

See application file for complete search history.

(56) References Cited

U.S. PATENT DOCUMENTS

| | | | | |
|---|---|---|---|---|
| 6,385,805 | B2 | 5/2002 | Konishi et al. | 134/902 |
| 2002/0023715 | A1 | 2/2002 | Kimura et al. | 156/345 |
| 2002/0059686 | A1 | 5/2002 | Uemukai et al. | 15/77 |
| 2002/0197878 | A1 | 12/2002 | Konishi et al. | 438/723 |
| 2007/0238395 | A1 | 10/2007 | Kimura et al. | 451/6 |
| 2009/0120472 | A1 | 5/2009 | Nishiyama et al. | 134/157 |
| 2010/0136884 | A1 | 6/2010 | Oh et al. | 451/5 |
| 2012/0014689 | A1 | 1/2012 | Ookouchi et al. | 396/611 |
| 2016/0101498 | A1 | 4/2016 | Yamaguchi et al. | |
| 2016/0236239 | A1 | 8/2016 | Nishiyama | |

FOREIGN PATENT DOCUMENTS

| | | | |
|---|---|---|---|
| JP | 09-148295 | A | 6/1997 |
| JP | 10-223597 | A | 8/1998 |
| JP | 10-303157 | A | 11/1998 |
| JP | 11-008212 | A | 1/1999 |
| JP | 11-040530 | A | 2/1999 |
| JP | 11-238714 | A | 8/1999 |
| JP | 2001-338902 | A | 12/2001 |
| JP | 2002-198345 | A | 7/2002 |
| JP | 3539834 | B2 | 7/2004 |
| JP | 3756284 | B2 | 3/2006 |
| JP | 2009-123800 | A | 6/2009 |
| JP | 2009-238861 | A | 10/2009 |
| JP | 2011-103394 | A | 5/2011 |
| JP | 2012-023209 | A | 2/2012 |
| JP | 2016-025259 | A | 2/2016 |
| KR | 1999-014121 | A | 2/1999 |
| KR | 10-2016-0100839 | A | 8/2016 |
| TW | I457204 | B | 10/2014 |

SUBSTRATE CLEANING DEVICE, SUBSTRATE PROCESSING APPARATUS, SUBSTRATE CLEANING METHOD AND SUBSTRATE PROCESSING METHOD

CROSS-REFERENCE TO RELATED APPLICATIONS

The present application is a divisional of U.S. patent application Ser. No. 15/697,727, filed Sep. 7, 2017, which claims priority to Japanese Patent Application No. 2016-178817, filed Sep. 13, 2016, the contents of all of which are incorporated herein by reference

BACKGROUND OF THE INVENTION

Field of the Invention

The present invention relates to a substrate cleaning device, a substrate processing apparatus, a substrate cleaning method and a substrate processing method for cleaning a substrate.

Description of Related Art

In a lithography process in manufacturing of a semiconductor device and the like, a coating film is formed by supply of a coating liquid such as a resist liquid onto a substrate. The coating film is exposed to exposure light and then developed, so that a predetermined pattern is formed on the coating film. Cleaning processing is performed on the substrate of which the coating film has not been exposed (see JP 2009-123800 A, for example).

In JP 2009-123800 A, a substrate processing apparatus having a cleaning drying processing unit is described. In the cleaning drying processing unit, the substrate is rotated while being horizontally held by a spin chuck. In this state, particles and the like adhering to a surface of the substrate are cleaned away by supply of a cleaning liquid to an upper surface of the substrate. Further, contaminants adhering to an entire back surface and an outer peripheral end of the substrate are removed by cleaning of the entire back surface and the outer peripheral end of the substrate by the cleaning liquid and a cleaning brush.

BRIEF SUMMARY OF THE INVENTION

It is desired that an even finer pattern is formed on a substrate. When contaminants, for example, particles, or particles covered with $SiO_2$ film or covered with SiN film etc., remain on the back surface of the substrate, or when suction marks, contact marks or the like remain on the back surface of the substrate, the back surface of the substrate is non-uniform, and it is difficult to perform exposure processing with high accuracy. Therefore, accuracy of pattern formation is degraded. Thus, it is necessary to remove contaminants, suction marks, contact marks and the like remaining on the back surface of the substrate. However, in the cleaning drying processing unit described in JP 2009-123800 A, it is difficult to remove contaminants firmly adhering to the back surface of the substrate, and suction marks, contact marks and the like firmly formed on the back surface of the substrate.

An object of the present invention is to provide a substrate cleaning device capable of making one surface of the substrate be clean and uniform, a substrate processing apparatus in which the one surface of the substrate can be clean and uniform, and a substrate cleaning method and a substrate processing method for making the one surface of the substrate be clean and uniform.

(1) A substrate cleaning device according to one aspect of the present invention that removes contaminants from one surface of a substrate includes a rotation holder that holds and rotates the substrate in a horizontal attitude, a polisher configured to be capable of coming into contact with the one surface of the substrate, a first mover that moves the polisher at least between a center and an outer periphery of the substrate while bringing the polisher into contact with the one surface of the substrate rotated by the rotation holder, and a controller that controls at least one of the first mover and the rotation holder such that capacity for removing contaminants by the polisher is changed according to a position in a radial direction of the substrate rotated by the rotation holder.

In the substrate cleaning device, with the polisher in contact with the one surface of the rotating substrate, the polisher is moved at least between the center and the outer periphery of the substrate. In this case, the one surface of the substrate is polished by the polisher, whereby contaminants firmly adhering to the one surface of the substrate are removed.

In the above-mentioned configuration, it is possible to remove contaminants while preventing the one surface of the substrate from being polished non-uniformly by changing the capacity for removing contaminants by the polisher between a contaminated portion and an uncontaminated portion of the one surface of the substrate. Thus, the one surface of the substrate can be clean and uniform.

(2) The controller may change the capacity for removing contaminants by the polisher by changing a pushing force of the polisher by the first mover against the one surface of the substrate. Thus, the capacity for removing contaminants by the polisher can be changed by simple control.

(3) The controller may change the capacity for removing contaminants by the polisher by changing a moving speed of the polisher by the first mover between the center and the outer periphery of the substrate. Thus, the capacity for removing contaminants by the polisher can be changed by simple control.

(4) The first mover may include a rotation driver that rotates the polisher about an axis extending in an up-and-down direction, and the controller may change the capacity for removing contaminants by the polisher by changing a rotation speed of the polisher by the rotation driver while bringing the polisher into contact with the one surface of the substrate. Thus, the capacity for removing contaminants by the polisher can be changed by simple control.

(5) The controller may change the capacity for removing contaminants by the polisher by changing a rotation speed of the substrate by the rotation holder. Thus, the capacity for removing contaminants by the polisher can be changed by the simple control.

(6) The substrate cleaning device may further include a brush that can come into contact with the one surface of the substrate rotated by the rotation holder, and a second mover that, after the polisher is moved while being in contact with the one surface of the substrate, brings the brush into contact with the one surface of the substrate held by the rotation holder.

In this case, the one surface of the substrate is polished by the polisher, and then the one surface of the substrate is cleaned by the brush. Thus, contaminants generated by the polishing of the one surface of the substrate are removed. Therefore, the one surface of the substrate can be more sufficiently cleaned.

(7) A substrate processing apparatus according to another aspect of the present invention arranged to be adjacent to an exposure device includes a coating device that applies a photosensitive film to an upper surface of a substrate, the above-mentioned substrate cleaning device, and a transport device that transports the substrate among the coating device, the substrate cleaning device and the exposure device, wherein the substrate cleaning device removes contaminants from a lower surface, used as one surface of the substrate, before exposure processing for the substrate by the exposure device.

In the substrate processing apparatus, the contaminants on the lower surface of the substrate on which the exposure processing has not been performed are removed by the above-mentioned substrate cleaning device. With the above-mentioned substrate cleaning device, the lower surface of the substrate can be clean and uniform. As a result, an occurrence of processing defects in the substrate caused by the contaminants on the lower surface of the substrate is inhibited.

(8) A substrate cleaning method according to yet another aspect of the present invention for removing contaminants from one surface of a substrate includes the steps of holding and rotating the substrate in a horizontal attitude, moving a polisher at least between a center and an outer periphery of the substrate while bringing the polisher into contact with the one surface of the substrate rotated by the step of rotating the substrate, and changing capacity for removing contaminants by the polisher according to a position in a radial direction of the substrate rotated by the step of rotating the substrate.

In the substrate cleaning method, with the polisher in contact with the one surface of the rotating substrate, the polisher is moved at least between the center and the outer periphery of the substrate. In this case, the one surface of the substrate is polished by the polisher, whereby contaminants firmly adhering to the one surface of the substrate are removed.

In the above-mentioned method, the capacity for removing contaminants by the polisher is changed between a contaminated portion and an uncontaminated portion of the one surface of the substrate, whereby it is possible to remove contaminants while preventing the one surface of the substrate from being polished non-uniformly. Thus, the one surface of the substrate can be clean and uniform.

(9) A substrate processing method according to yet another aspect of the present invention includes the steps of applying a photosensitive film to an upper surface of a substrate, exposing the substrate to which the photosensitive film is applied, and removing contaminants from a lower surface, used as the one surface of the substrate, by the above-mentioned substrate cleaning method before the step of exposing the substrate.

In the substrate processing method, contaminants on the lower surface of the substrate on which the exposure processing has not been performed are removed by the above-mentioned substrate cleaning method. In the above-mentioned cleaning method, the lower surface of the substrate can be made clean and uniform. As a result, an occurrence of processing defects in the substrate caused by contaminants on the lower surface of the substrate is inhibited.

DESCRIPTION OF THE PREFERRED EMBODIMENTS

A substrate cleaning device, a substrate processing apparatus, a substrate cleaning method and a substrate processing method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, an upper surface of the substrate refers to as a surface of the substrate directed upward, and a lower surface of the substrate refers to a surface directed downward.

(1) Substrate Cleaning Device

Figure 1:
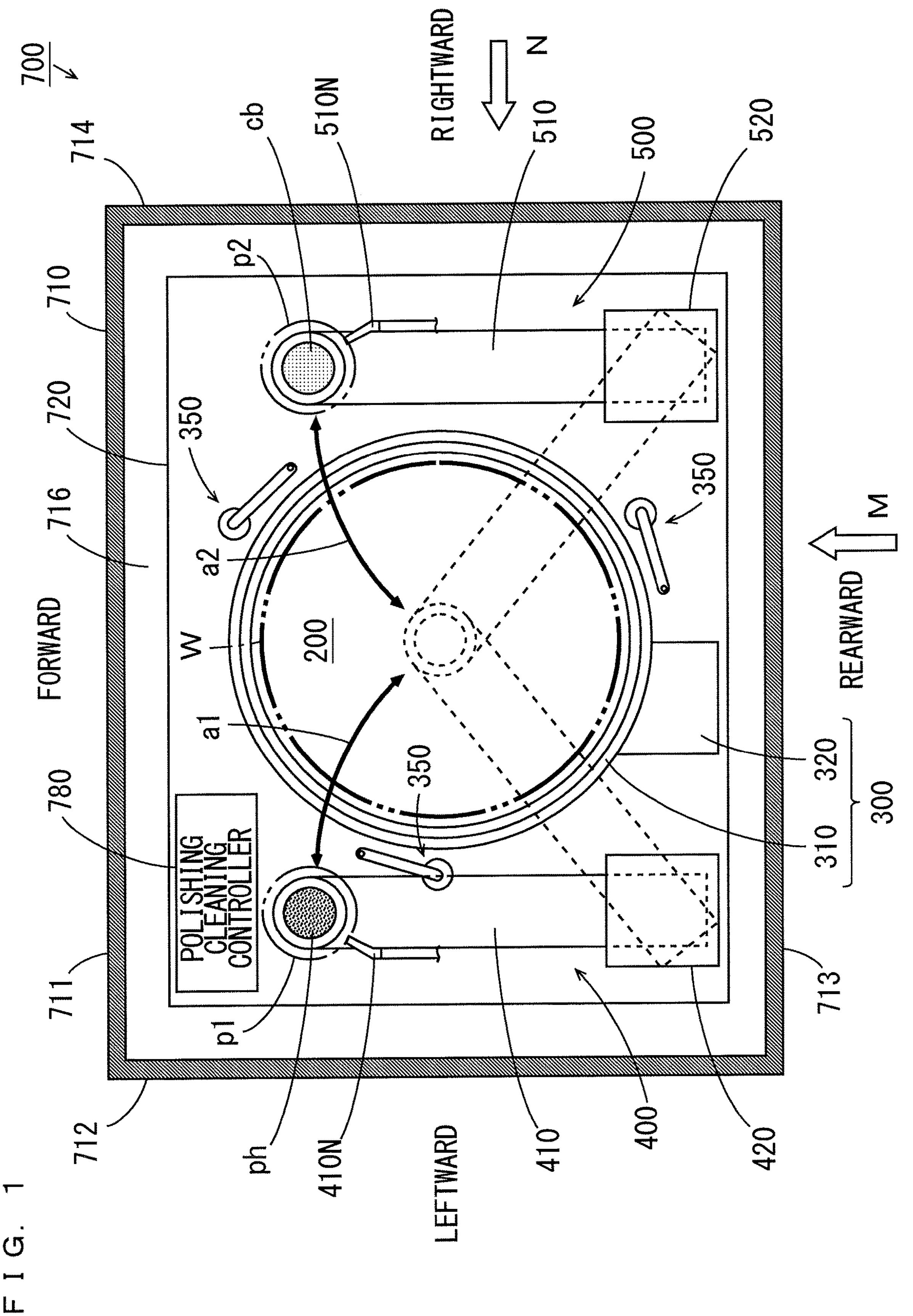
FIG. 1 is a schematic plan view showing a schematic configuration of a substrate cleaning device according to one embodiment of the present invention.
Figure 2:
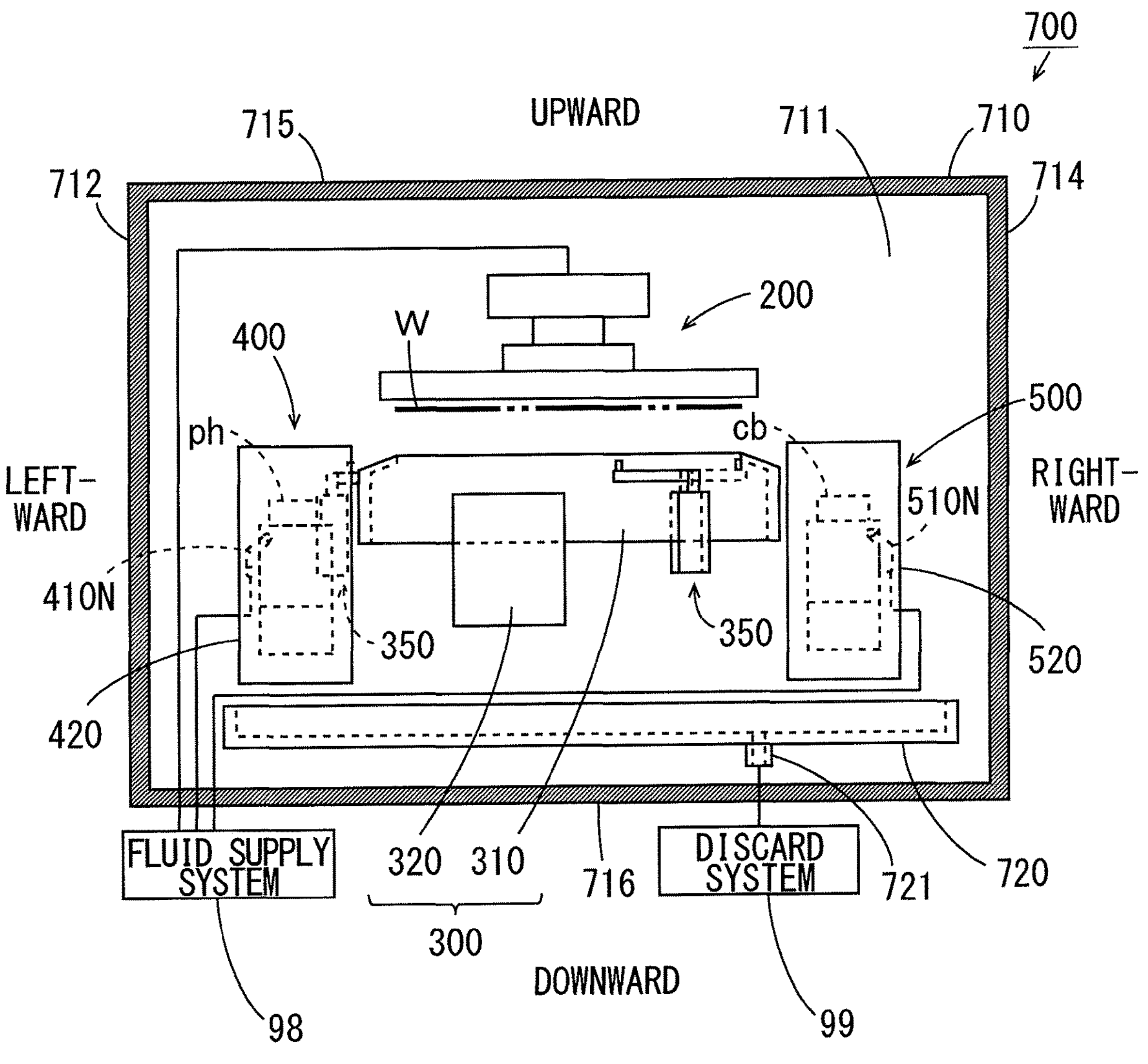
FIG. 2 is a schematic side view of the substrate cleaning device of FIG. 1 as viewed in a direction of an arrow M.
Figure 3:
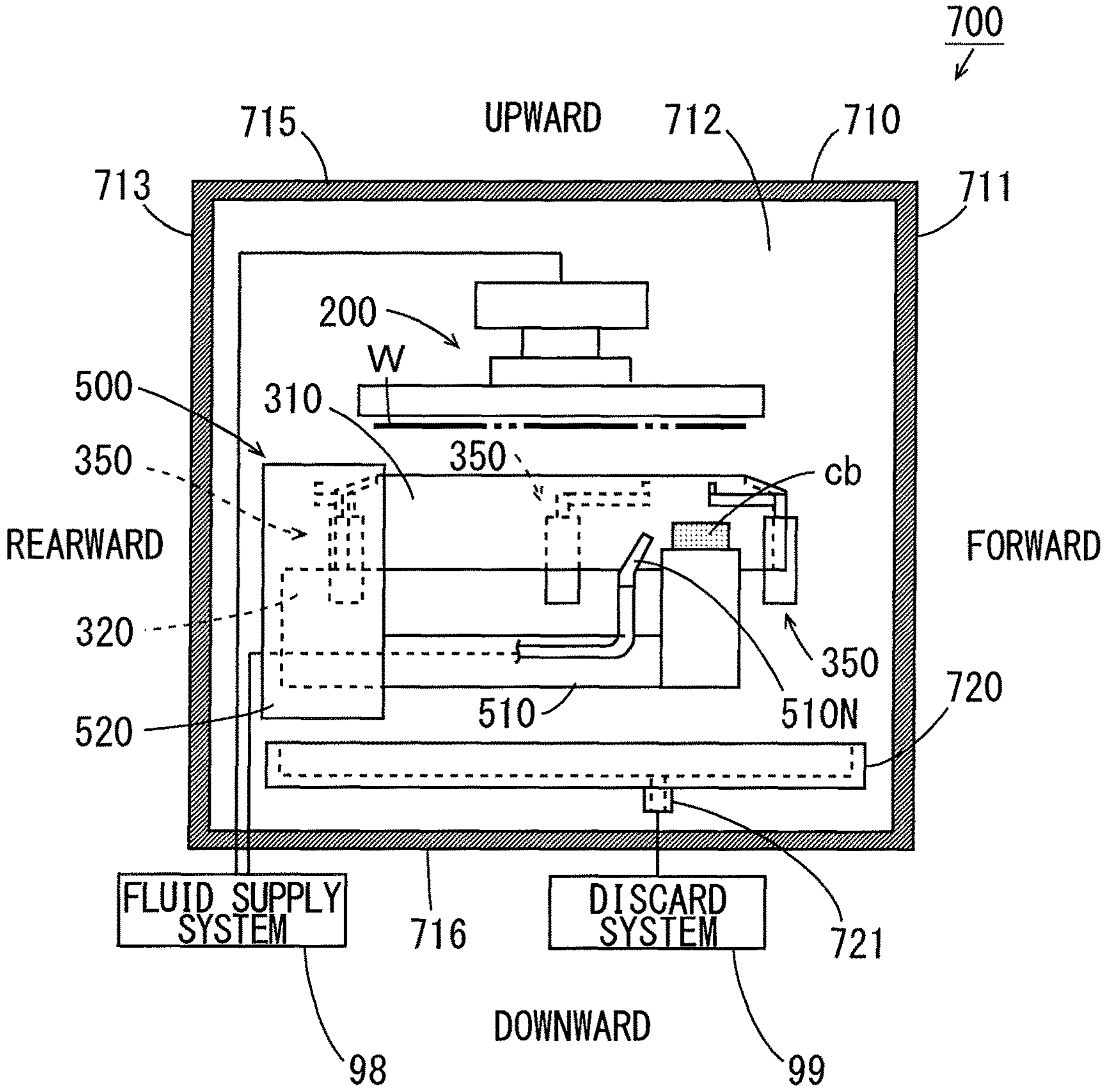
FIG. 3 is a schematic side view of the substrate cleaning device of FIG. 1 as viewed in a direction of an arrow N.

FIG. 1 is a schematic plan view showing a schematic configuration of the substrate cleaning device according to the one embodiment of the present invention, FIG. 2 is a schematic side view of the substrate cleaning device 700 of FIG. 1 as viewed in a direction of an arrow M, and FIG. 3 is a schematic side view of the substrate cleaning device 700 of FIG. 1 as viewed in a direction of an arrow N.

As shown in FIGS. 1 to 3, the substrate cleaning device 700 includes a spin chuck 200, a guard mechanism 300, a plurality (three in the present example) of receiving transferring mechanisms 350, a substrate polishing mechanism 400, a substrate cleaning mechanism 500, a casing 710, a liquid receiving vat 720 and a polishing cleaning controller 780. In each of FIGS. 2 and 3, the polishing cleaning controller 780 is not shown.

The casing 710 has four sidewalls 711, 712, 713, 714 (FIG. 1), a ceiling portion 715 (FIG. 2) and a bottom surface portion 716 (FIG. 2). The sidewalls 711, 713 are opposite to each other, and the sidewalls 712, 714 are opposite to each other. In the sidewall 711, an opening (not shown) for allowing the substrate W to be carried in and carried out between the inside and the outside of the casing 710 is formed. The ceiling portion 715 is not shown in FIG. 1, the sidewall 713 is not shown in FIG. 2, and the sidewall 714 is not shown in FIG. 3.

In the following description, a direction directed from the inside of the casing 710 towards the outside of the casing 710 through the sidewall 711 is referred to as forward of the substrate cleaning device 700, and a direction directed from the inside of the casing 710 towards the outside of the casing 710 through the sidewall 713 is referred to as rearward of the substrate cleaning device 700. Further, a direction directed from the inside of the casing 710 towards the outside of the casing 710 through the sidewall 712 is referred to as leftward of the substrate cleaning device 700, and a direction directed from the inside of the casing 710 towards the outside of the casing 710 through the sidewall 714 is referred to as rightward of the substrate cleaning device 700.

The spin chuck 200 is provided at a position above a center portion inside of the casing 710. The spin chuck 200 holds and rotates the substrate W in a horizontal attitude. In each of FIGS. 1 to 3, the substrate W held by the spin chuck 200 is indicated by a thick two-dots and dash line. As shown in each of FIGS. 2 and 3, the spin chuck 200 is connected to a fluid supply system 98 through a pipe. The fluid supply system 98 includes a pipe, a valve, a flowmeter, a regulator, a pump, a temperature adjustor and the like, and can supply a cleaning liquid to a below-mentioned liquid supply pipe 215 (FIG. 6) of the spin chuck 200.

The guard mechanism 300 and the three receiving transferring mechanisms 350 are provided below the spin chuck 200 to surround a space below the spin chuck 200. The guard mechanism 300 includes a guard 310 and a guard lifting lowering driver 320. Details of the spin chuck 200, the guard mechanism 300 and the three receiving transferring mechanisms 350 will be described below.

The substrate polishing mechanism 400 is provided at a position further leftward than the guard mechanism 300 and the plurality of receiving transferring mechanisms 350. The substrate polishing mechanism 400 includes an arm 410 and an arm support post 420. The arm support post 420 extends in an up-and-down direction in the vicinity of the sidewall 713 located behind the arm support post 420. The arm 410 extends in a horizontal direction from the arm support post 420 with its one end supported inside of the arm support post 420 to be liftable, lowerable and rotatable.

A polishing head ph for removing contaminants from a lower surface of the substrate W held by the spin chuck 200 by polishing is attached to the other end of the arm 410. In the present invention, contamination of the substrate W refers to a state where the substrate W is contaminated by contaminants, suction marks, contact marks or the like.

The polishing head ph is columnar and formed of a PVA (polyvinyl alcohol) sponge in which abrasive grains are dispersed, for example. A driving system (see FIG. 4, described below) for rotating the polishing head ph about its central axis is provided inside of the arm 410. An outer diameter of the polishing head ph is smaller than a diameter of the substrate W. In the case where the diameter of the substrate W is 300 mm, the outer diameter of the polishing head ph is set to about 20 mm, for example.

A nozzle 410N is attached to a portion, in the vicinity of the polishing head ph, of the arm 410. As shown in FIG. 2, the nozzle 410N is connected to the fluid supply system 98 through a pipe. The fluid supply system 98 can supply a cleaning liquid to the nozzle 410N. In the present embodiment, pure water is used as the cleaning liquid. A discharge port of the nozzle 410N is directed towards the vicinity of an upper end surface (a polishing surface) of the polishing head ph.

With the polishing head ph not polishing the substrate W, the arm 410 is supported by the arm support post 420 to extend in a front-and-rear direction of the substrate cleaning device 700. At this time, the polishing head ph is located outward (leftward) of the substrate W held by the spin chuck 200. In this manner, a position at which the polishing head ph is arranged with the arm 410 extending in the front-and-rear direction is referred to as a head waiting position p1. The head waiting position p1 is indicated by a two-dots and dash line in FIG. 1.

When the polishing head ph polishes the substrate W, the arm 410 is rotated about the arm support post 420. Thus, as indicated by a thick arrow a1 in FIG. 1, at a height lower than the substrate W, the polishing head ph is moved between a position opposite to a center of the substrate W held by the spin chuck 200 and the head waiting position p1. Further, the height of the arm 410 is adjusted such that the upper end surface (the polishing surface) of the polishing head ph comes into contact with the lower surface of the substrate W.

The substrate cleaning mechanism 500 is provided at a position further rightward than the guard mechanism 300 and the plurality of receiving transferring mechanisms 350. The substrate cleaning mechanism 500 includes an arm 510 and an arm support post 520. The arm support post 520 extends in the up-and-down direction in the vicinity of the sidewall 713 located behind the arm support post 520. The arm 510 extends in the horizontal direction from the arm support post 520 with its one end supported inside of the arm support post 520 to be liftable, lowerable and rotatable.

A cleaning brush cb for cleaning the lower surface of the substrate W held by the spin chuck 200 without polishing it is attached to the other end of the arm 510. The cleaning brush cb is columnar and formed of a PVA sponge, for example. A driving system (not shown) for rotating the cleaning brush cb about its central axis is provided inside of the arm 510. In the present example, an outer diameter of the cleaning brush cb is equal to an outer diameter of the polishing head ph. The outer diameter of the cleaning brush cb and the outer diameter of the polishing head ph may be set different from each other.

A nozzle 510N is attached to a portion, in the vicinity of the cleaning brush cb, of the arm 510. As shown in FIG. 2, the nozzle 510N is connected to the fluid supply system 98 through a pipe. The fluid supply system 98 can supply a cleaning liquid to the nozzle 510N. A discharge port of the nozzle 510N is directed towards the vicinity of an upper end surface (a cleaning surface) of the cleaning brush cb.

With the cleaning brush cb not cleaning the substrate W, the arm 510 is supported by the arm support post 520 to extend in the front-and-rear direction of the substrate cleaning device 700. At this time, the cleaning brush cb is located outward (rightward) of the substrate W held by the spin chuck 200. In this manner, a position at which the cleaning brush cb is arranged with the arm 510 extending in the front-and-rear direction is referred to as a brush waiting position p2. The brush waiting position p2 is indicated by a two-dots and dash line in FIG. 1.

When the cleaning brush cb cleans the substrate W, the arm 510 is rotated about the arm support post 520. Thus, as indicated by a thick arrow a2 in FIG. 1, at a height lower than the substrate W, the cleaning brush cb is moved between a position opposite to the center of the substrate W held by the spin chuck 200 and the brush waiting position p2. Further, the height of the arm 510 is adjusted such that the upper end surface (the cleaning surface) of the cleaning brush cb comes into contact with the lower surface of the substrate W.

The liquid receiving vat 720 is provided on the bottom surface portion 716 of the substrate cleaning device 700 to be located below the spin chuck 200, the guard mechanism 300, the plurality of receiving transferring mechanisms 350, the substrate polishing mechanism 400 and the substrate cleaning mechanism 500. The liquid receiving vat 720 receives the cleaning liquid that falls from each part in the casing 710. As shown in FIGS. 2 and 3, a liquid discard portion 721 is provided at the liquid receiving vat 720. The liquid discard portion 721 is connected to a discard system 99 through a pipe.

The polishing cleaning controller 780 includes a CPU (Central Processing Unit), a ROM (Read Only Memory), a RAM (Random Access Memory) and the like. A control program is stored in the ROM. The CPU controls an operation of each part of the substrate cleaning device 700 by executing the control program stored in the ROM using the RAM.

In the substrate cleaning device 700 according to the present embodiment, during the polishing of the lower surface of the substrate W by the polishing head ph of the substrate polishing mechanism 400, capacity for removing contaminants by the polishing head ph can be changed according to a position in a radial direction of the substrate W. Here, removing capacity refers to the capacity for removing contaminants from the substrate W, and specifically refers to the capacity for scraping contaminants adhering to the one surface (the lower surface in the present example) of the substrate, suction marks remaining on the one surface of the substrate, contact marks remaining on the one surface of the substrate or the like by polishing the one surface of the substrate.

Removal information indicating the capacity, for removing contaminants, to be set according to a position in the radial direction of the substrate W is further stored in the ROM or the RAM of the polishing cleaning controller 780. The removal information is produced when a user of the substrate cleaning device 700 operates an operation unit (not shown), for example. Details of the removal information will be described below.

(2) Details of Substrate Polishing Mechanism and Substrate Cleaning Mechanism

The substrate polishing mechanism 400 and the substrate cleaning mechanism 500 of FIGS. 1 to 3 basically have the same configuration except that the different members (the polishing head ph and the cleaning brush cb) are respectively provided at the other ends of the arms 410, 510. Thus, the configuration of the substrate polishing mechanism 400 is described as a representative of the substrate polishing mechanism 400 and the substrate cleaning mechanism 500.

Figure 4:
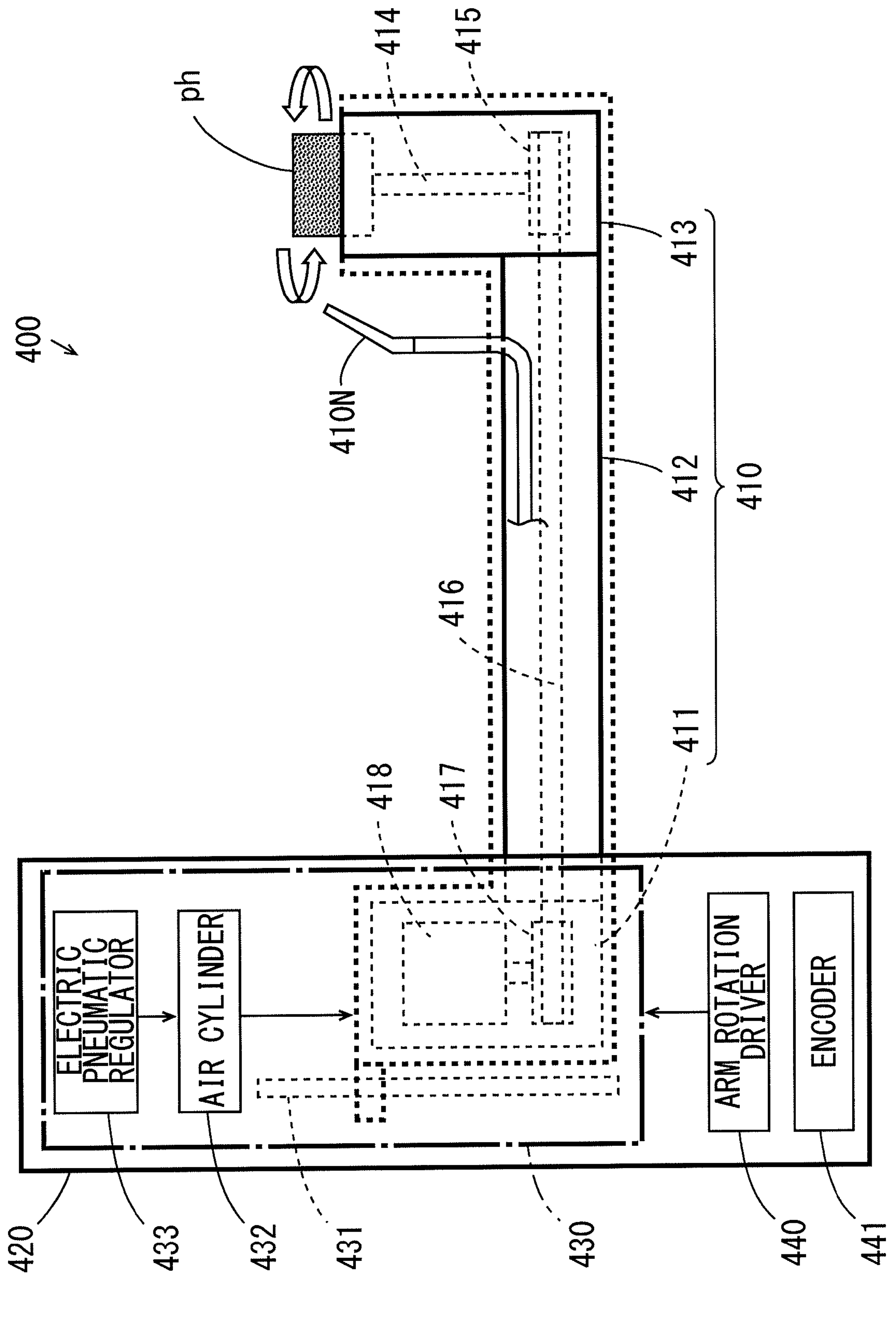
FIG. 4 is a schematic side view showing a configuration of a substrate polishing mechanism of FIGS. 1 and 2.

FIG. 4 is a schematic side view showing the configuration of the substrate polishing mechanism 400 of FIGS. 1 and 2. As shown in FIG. 4, the arm 410 includes a one arm end 411, an arm main body 412 and another arm end 413 that are integrally connected to one another. An arm lifting lowering driver 430, which supports the one arm end 411 of the arm 410 such that the one arm end 411 of the arm 410 is liftable and lowerable, is provided inside of the arm support post 420. Further, an arm rotation driver 440 that rotatably supports the arm 410 and the arm lifting lowering driver 430 about a central axis of the arm support post 420 is provided inside of the arm support post 420.

A pulley 417 and a motor 418 are provided inside of the one arm end 411. The pulley 417 is connected to a rotation shaft of the motor 418. Further, a rotation support shaft 414 and a pulley 415 are provided inside of the other arm end 413. The polishing head ph is attached to an upper end of the rotation support shaft 414. The pulley 415 is attached to a lower end of the rotation support shaft 414. Further, a belt 416 that connects the two pulleys 415, 417 to each other is provided inside of the arm main body 412. When the motor 418 is operated based on the control of the polishing cleaning controller 780 of FIG. 1, a rotational force of the motor 418 is transmitted to the polishing head ph via the pulley 417, the belt 416, the pulley 415 and the rotation support shaft 414. Thus, the polishing head ph is rotated about an axis extending in the up-and-down direction.

The arm lifting lowering driver 430 includes a linear guide 431 extending in a vertical direction, an air cylinder 432 and an electric pneumatic regulator 433. The one arm end 411 is attached to the linear guide 431 to be liftable and lowerable. In this state, the one arm end 411 is connected to the air cylinder 432.

The air cylinder 432 is provided to be extendible and contractible in the vertical direction by the supply of air through the electric pneumatic regulator 433. The electric pneumatic regulator 433 is an electrical control type regulator controlled by the polishing cleaning controller 780 of FIG. 1. The length of the air cylinder 432 changes according to a pressure of the air supplied to the air cylinder 432 from the electric pneumatic regulator 433. Thus, the one arm end 411 is moved to a height corresponding to the length of the air cylinder 432.

The arm rotation driver 440 includes a motor and a plurality of gears, for example, and is controlled by the polishing cleaning controller 780 of FIG. 1. The arm support post 420 is further provided with an encoder 441 for detecting a rotation angle of the arm 410. The encoder 441 detects the rotation angle of the arm 410 with respect to a direction in which the arm 410 extends when the polishing head ph is located at the head waiting position p1 and supplies a signal indicating a result of detection to the polishing cleaning controller 780 of FIG. 1. Thus, the rotation angle of the arm 410 is controlled by feedback control.

Figure 5:
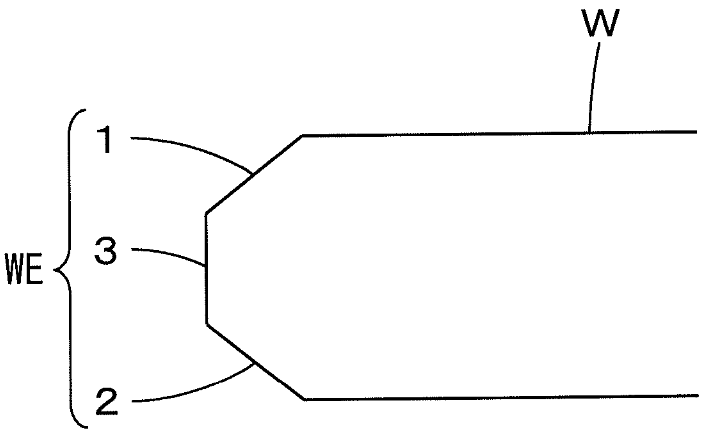
FIG. 5 is an enlarged side view showing the structure of an outer peripheral end of a substrate.

(3) Details of Spin Chuck, Guard Mechanism and Plurality of Substrate Receiving Transferring Mechanisms First, the structure of the outer peripheral end of the substrate W held by the spin chuck 200 of FIG. 1 will be described. FIG. 5 is an enlarged side view showing the structure of the outer peripheral end of the substrate W. As shown in FIG. 5, the outer peripheral end WE of the substrate W includes a bevel portion 1 on the upper surface side, a bevel portion 2 on the lower surface side and an end surface 3. In the following description, the peripheral portion of the lower surface of the substrate W means a region that extends inward from the bevel portion 2 of the substrate W by a predetermined width, and the width is smaller than an outer diameter of each of the polishing head ph and the cleaning brush cb.

Figure 6:
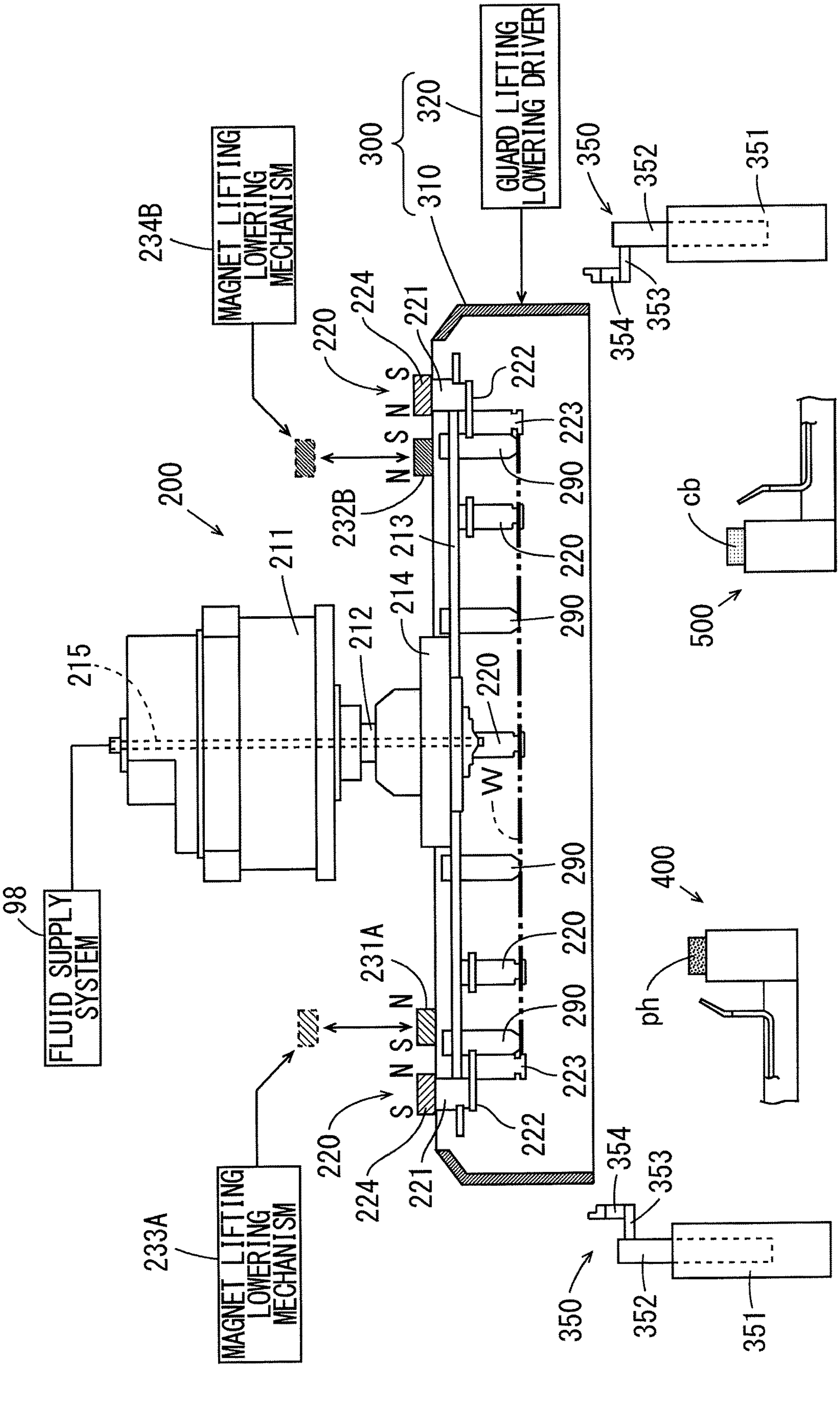
FIG. 6 is a schematic side view for explaining configurations of a spin chuck and its peripheral members of FIG. 1.
Figure 7:
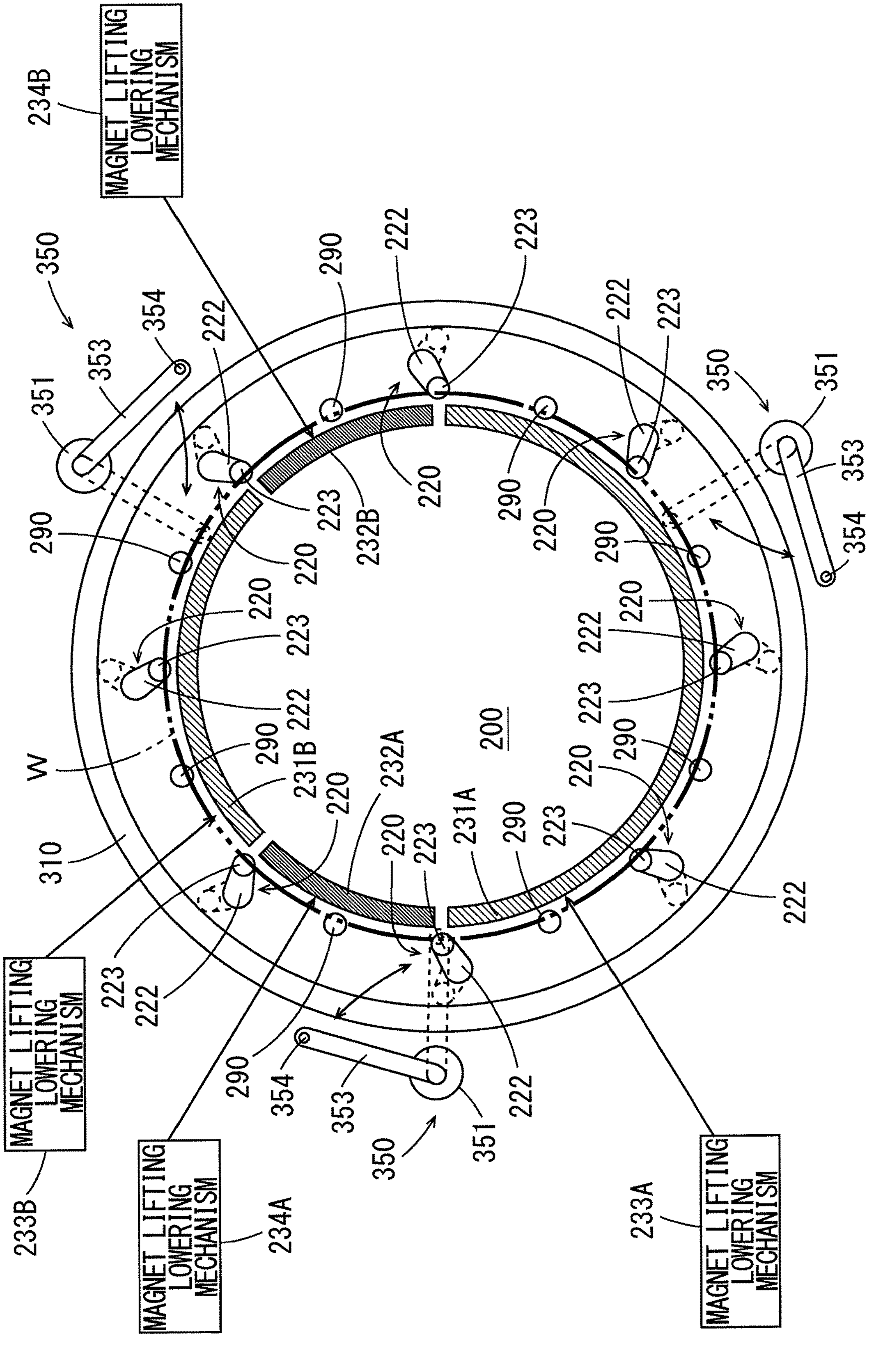
FIG. 7 is a schematic plan view for explaining the configurations of the spin chuck and its peripheral members of FIG. 1.

FIG. 6 is a schematic side view for explaining a configuration of the spin chuck 200 and its peripheral members of FIG. 1, and FIG. 7 is a schematic plan view for explaining the configuration of the spin chuck 200 and its peripheral members of FIG. 1. In each of FIGS. 6 and 7, the substrate W held by the spin chuck 200 is indicated by a thick two-dots and dash line.

As shown in FIGS. 6 and 7, the spin chuck 200 includes a spin motor 211, a disc-shape spin plate 213, a plate support member 214, four magnet plates 231A, 231B, 232A, 232B, four magnet lifting lowering mechanisms 233A, 233B, 234A, 234B, a plurality of chuck pins 220 and a plurality of auxiliary pins 290.

The spin motor 211 is supported by a support member (not shown) at a position slightly above the center inside of the casing 710 of FIG. 1. The spin motor 211 has a rotation shaft 212 that extends downward. The plate support member 214 is attached to the lower end of the rotation shaft 212. The spin plate 213 is horizontally supported by the plate support member 214. The rotation shaft 212 is rotated by an operation of the spin motor 211, and the spin plate 213 is rotated about a vertical axis.

The liquid supply pipe 215 is inserted into the rotation shaft 212 and the plate support member 214. One end of the liquid supply pipe 215 projects downward from the lower end of the plate support member 214. The other end of the liquid supply pipe 215 is connected to the fluid supply system 98 through the pipe. The cleaning liquid is discharged onto the upper surface of the substrate W held by the spin chuck 200 from the fluid supply system 98 through the liquid supply pipe 215.

The plurality of chuck pins 220 are provided at the peripheral portion of the spin plate 213 at equal angular intervals with respect to the rotation shaft 212. In the present example, the eight chuck pins 220 are provided at the peripheral portion of the spin plate 213 at angular intervals of 45 degrees with respect to the rotation shaft 212. Each chuck pin 220 includes a shaft portion 221, a pin supporter 222, a holder 223 and a magnet 224.

The shaft portion 221 is provided to penetrate the spin plate 213 in the perpendicular direction. The pin supporter 222 is provided to extend in the horizontal direction from a lower end of the shaft portion 221. The holder 223 is provided to project downward from a tip end of the pin supporter 222. Further, the magnet 224 is attached to an upper end of the shaft portion 221 on the upper surface side of the spin plate 213.

Each chuck pin 220 is rotatable about a vertical axis and the shaft portion 221, and can be switched between a closed state where the holder 223 is in contact with the outer peripheral end WE (FIG. 5) of the substrate W and an opened state where the holder 223 is spaced apart from the outer peripheral end WE of the substrate W. In the present example, each chuck pin 220 is in the closed state in the case where an N pole of the magnet 224 is on the inner side, and each chuck pin 220 is in the opened state in the case where an S pole of the magnet 224 is on the inner side. Further, in the closed state, the holder 223 is in contact with the bevel portions 1, 2 (FIG. 5) of the substrate W.

In a position above spin plate 213, as shown in FIG. 7, the four arc-like magnet plates 231A, 231B, 232A, 232B are arranged in a circumferential direction extending about the rotation shaft 212. The magnet plate 232A of the four magnet plates 231A, 231B, 232A, 232B is located above a path on which the polishing head ph is moved by rotation of the arm 410 of the substrate polishing mechanism 400 of FIG. 1. Further, the magnet plate 232B is located above a path on which the cleaning brush cb is moved by rotation of the arm 510 of the substrate cleaning mechanism 500 of FIG. 1.

Each of the magnet plates 231A, 231B, 232A, 232B has an S pole on the outside and has an N pole on the inside. The magnet lifting lowering mechanisms 233A, 233B, 234A, 234B respectively lift and lower the magnet plates 231A, 231B, 232A, 232B. Thus, each of the magnet plates 231A, 231B, 232A, 232B can be independently moved between an upper position higher than the magnet 224 of the chuck pin 220 and a lower position at a height substantially equal to the height of the magnet 224 of the chuck pin 220.

Each chuck pin 220 is switched between the opened state and the closed state by the lifting and lowering of the magnet plates 231A, 232B, 232A, 232B. Specifically, each chuck pin 220 enters the opened state in the case where a magnet plate, closest to the chuck pin 220, of the plurality of magnet plates 231A, 231B, 232A, 232B is located at the upper position. On the other hand, each chuck pin 220 enters the closed state in the case where a magnet plate, closest to the chuck pin 220, of the plurality of magnet plates 231A, 231B, 232A, 232B is located at the lower position.

As shown in FIGS. 6 and 7, the plurality of auxiliary pins 290 are provided at the peripheral portion of the spin plate 213 at equal angular intervals with respect to the rotation shaft 212, and provided not to interfere with the plurality of chuck pins 220. In the present example, the eight auxiliary pins 290 are provided at the peripheral portion of the spin plate 213 at angular intervals of 45 degrees with respect to the rotation shaft 212. Each auxiliary pin 290 is arranged to penetrate the spin plate 213 in the perpendicular direction at a middle position between two adjacent chuck pins 220. With each chuck pin 220 in the closed state and the holder 223 in contact with the bevel portions 1, 2 (FIG. 5) of the substrate W, part of each auxiliary pin 290 is in contact with the bevel portion 1 of the substrate W. At this time, the lower end of the auxiliary pin 290 is formed not to project downward from the substrate W.

During the polishing of the lower surface of the substrate W, the auxiliary pin 290 generates a reaction force in the substrate W against a pushing force applied to the lower surface of the substrate W by the polishing head ph of the substrate polishing mechanism 400. Further, during the cleaning of the lower surface of the substrate W, the auxiliary pin 290 generates a reaction force in the substrate W against the pushing force applied to the lower surface of the substrate W by the cleaning brush cb of the substrate cleaning mechanism 500.

As described above, the guard mechanism 300 includes the guard 310 and the guard lifting lowering driver 320. In FIG. 6, the guard 310 is shown in the longitudinal cross sectional view. The guard 310 is rotationally symmetric with respect to the rotation shaft 212 of the spin chuck 200, and provided at a position further outward than the spin chuck 200 and a space below the spin chuck 200. The guard lifting lowering driver 320 lifts and lowers the guard 310. The guard 310 receives the cleaning liquid splashed from the substrate W during the polishing and the cleaning of the substrate W and leads the cleaning liquid to the liquid receiving vat 720 of FIG. 1.

The plurality of receiving transferring mechanisms 350 are arranged around the rotation shaft 212 of the spin chuck 200 at equal angular intervals and at positions outward of the guard 310. Each receiving transferring mechanism 350 includes a lifting lowering rotation driver 351, a rotation shaft 352, an arm 353 and a holding pin 354.

The rotation shaft 352 is provided to extend upward from the lifting lowering rotation driver 351. The arm 353 is provided to extend in the horizontal direction from an upper end of the rotation shaft 352. The holding pin 354 is provided at a tip end of the arm 353 to be capable of holding the outer peripheral end WE of the substrate W. The rotation shaft 352 performs a lifting lowering operation and a rotating operation by the lifting lowering rotation driver 351. Thus, the holding pin 354 is moved in the horizontal direction and the up-and-down direction.

(4) Control System of Substrate Cleaning Device

Figure 8:
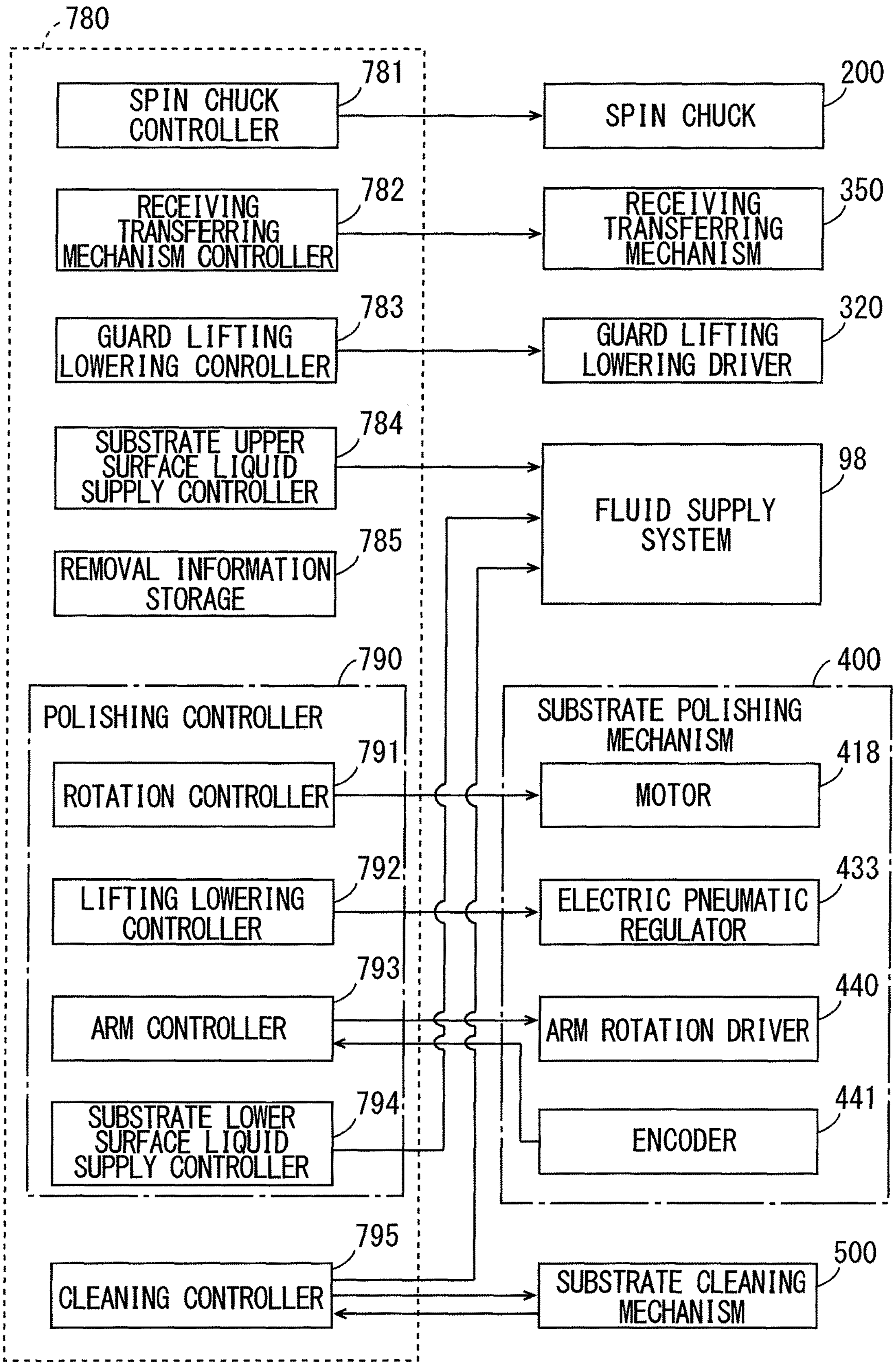
FIG. 8 is a block diagram showing a configuration of a control system of the substrate cleaning device of FIG. 1.

FIG. 8 is a block diagram showing the configuration of the control system of the substrate cleaning device 700 of FIG. 1. In FIG. 8, the functional configuration of the polishing cleaning controller 780 is shown. The polishing cleaning controller 780 includes a spin chuck controller 781, a receiving transferring mechanism controller 782, a guard lifting lowering controller 783, a substrate upper surface liquid supply controller 784, a removal information storage 785, a polishing controller 790 and a cleaning controller 795. The substrate cleaning controller 790 further includes a rotation controller 791, a lifting lowering controller 792, an arm controller 793 and a substrate lower surface liquid supply controller 794. The function of each part of the polishing cleaning controller 780 of FIG. 8 is realized by the execution of the control program by the CPU.

Each constituent element of the polishing controller 790 controls an operation of each part of the substrate polishing mechanism 400. More specifically, the rotation controller 791 adjusts a rotation speed of the polishing head ph (FIG. 4) by controlling the motor 418 of the substrate polishing mechanism 400. The lifting lowering controller 792 adjusts the height of the polishing head ph (FIG. 4) by controlling the electric pneumatic regulator 433 of the substrate polishing mechanism 400. The arm controller 793 performs feedback control of the rotation angle of the arm 410 (FIG. 4) by controlling the arm rotation driver 440 based on a signal from the encoder 441 of the substrate polishing mechanism 400. The substrate lower surface liquid supply controller 794 adjusts a supply amount of the cleaning liquid from the nozzle 410N (FIG. 4) of the substrate polishing mechanism 400 to the substrate W by controlling the fluid supply system 98.

The cleaning controller 795 controls an operation of the substrate cleaning mechanism 500. The substrate cleaning mechanism 500 basically has the same configuration as that of the substrate polishing mechanism 400 as described above. Therefore, the cleaning controller 795 basically has the same configuration as that of the polishing controller 790.

The spin chuck controller 781 controls an operation of each part of the spin chuck 200. The receiving transferring mechanism controller 782 controls operations of the plurality of receiving transferring mechanisms 350 provided in the substrate cleaning device 700. The guard lifting lowering controller 783 adjusts the height of the guard 310 (FIG. 1) by controlling the guard lifting lowering driver 320 (FIG. 1) of the guard mechanism 300. The substrate upper surface liquid supply controller 784 adjusts the supply amount of the cleaning liquid from the liquid supply pipe 215 (FIG. 6) of the spin chuck 200 to the substrate W by controlling the fluid supply system 98. The removal information storage 785 is mainly constituted by part of the ROM or the RAM of the polishing cleaning controller 780 and stores the above-mentioned removal information.

(5) Polishing and Cleaning of Lower Surface of Substrate by Substrate Cleaning Device In the substrate cleaning device 700 of FIG. 1, the substrate W is carried into the casing 710, for example, and then cleaning of the upper surface of the substrate W, the polishing of the lower surface of the substrate W and the cleaning of the lower surface of the substrate W are continuously performed in this order. The basic operation of the substrate cleaning device 700 during this time period will be described.

Figure 9A:
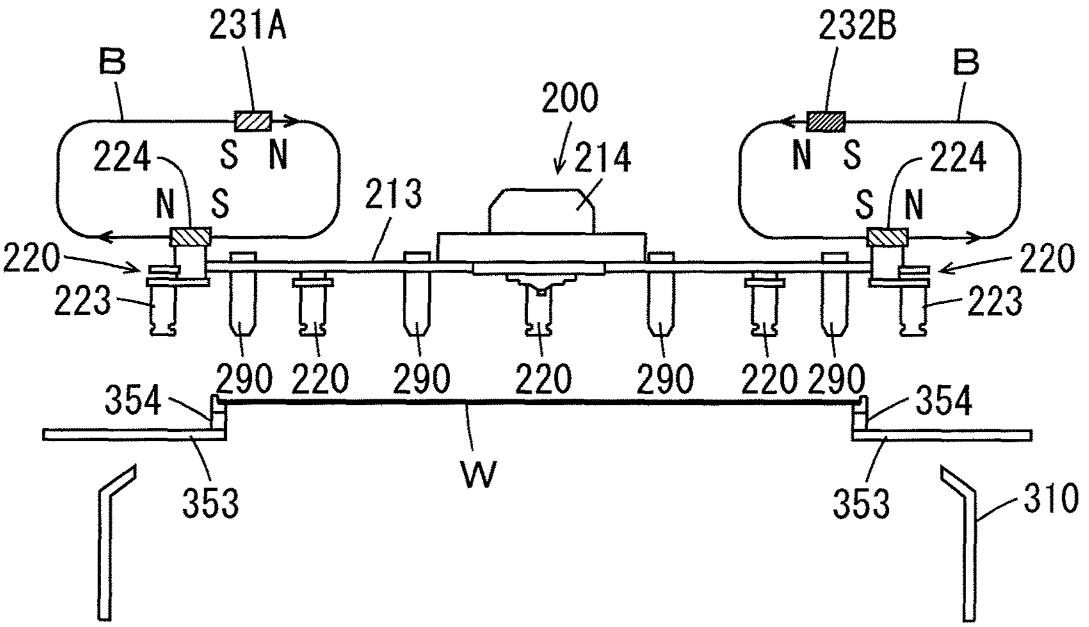
FIGS. 9A and 9B are side views showing an operation of the substrate cleaning device when the substrate is carried into a casing.

FIGS. 9A to 10B are side views showing the operation of the substrate cleaning device 700 when the substrate W is carried into the casing 710. First, as shown in FIG. 9A, the guard 310 is moved to a position lower than the chuck pins 220. Then, the holding pins 354 of the plurality of receiving transferring mechanisms 350 (FIG. 6) are moved to positions below the spin plate 213 through a position above the guard 310. The substrate W is placed on the plurality of holding pins 354 by the transport mechanism (not shown).

At this time, all of the magnet plates 231A, 231B, 232A, 232B (FIG. 7) are located at the upper positions. In this case, lines B of magnetic force of the magnetic plates 231A, 231B, 232A, 232B are directed outward at the height of the magnet 224 of the chuck pin 220. Thus, the S pole of the magnet 224 of each chuck pin 220 is attracted inward. Thus, each chuck pin 220 enters the opened state.

Figure 9B:
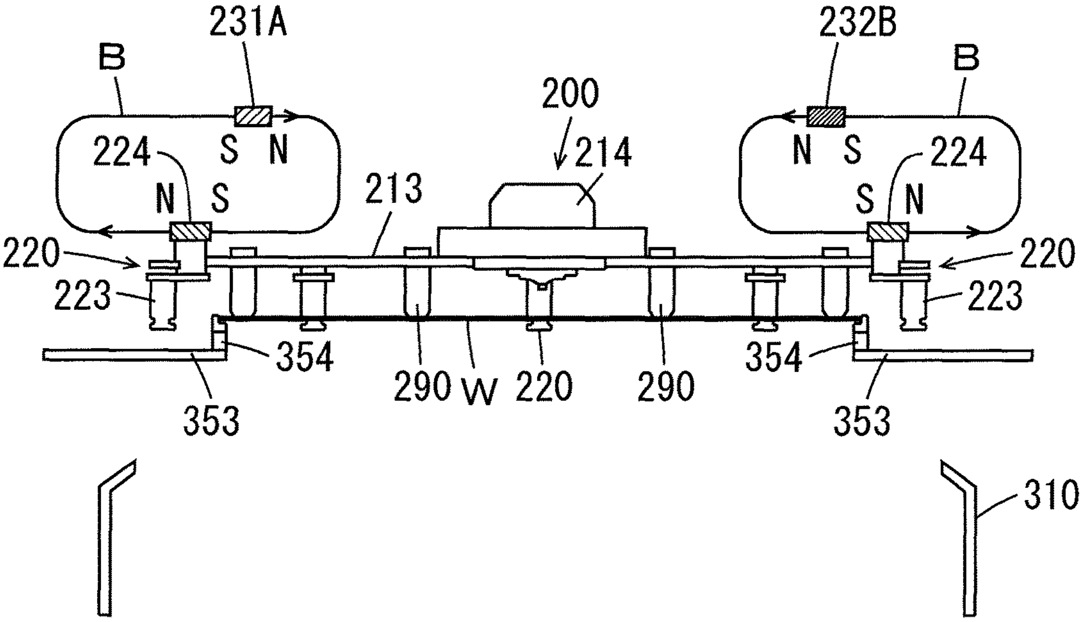

Next, as shown in FIG. 9B, the plurality of holding pins 354 are lifted while holding the substrate W. Thus, the substrate W is moved to a position among the holders 223 of the plurality of chuck pins 220. Further, the bevel portion 1 (FIG. 5) of the substrate W comes into contact with the plurality of auxiliary pins 290.

Figure 10A:
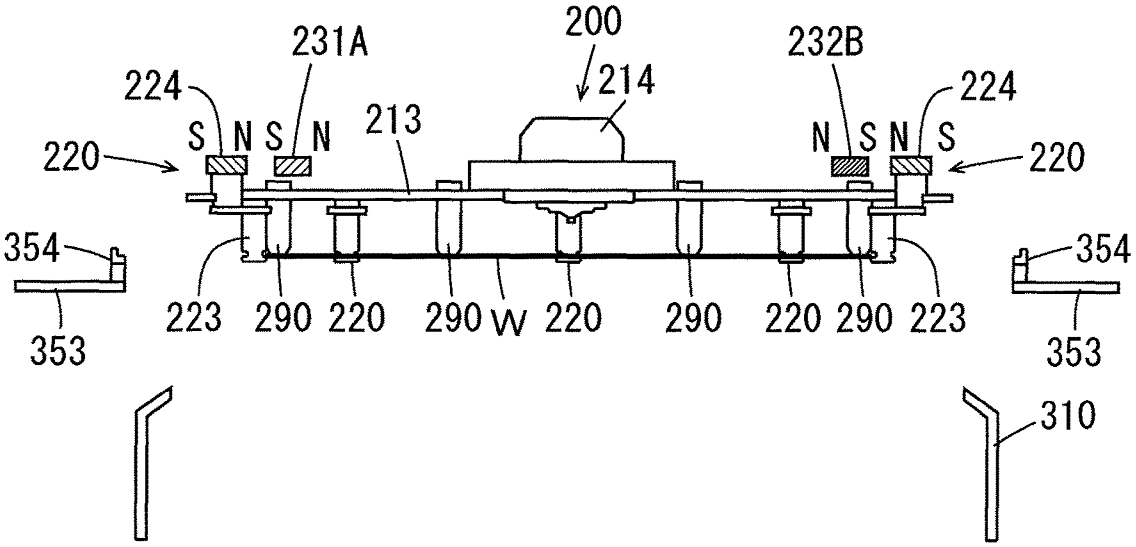
FIGS. 10A and 10B are side views showing the operation of the substrate cleaning device when the substrate is carried into the casing.

Subsequently, as shown in FIG. 10A, all of the magnet plates 231A, 231B, 232A, 232B (FIG. 7) are moved to the lower positions. In this case, the N pole of the magnet 224 of each chuck pin 220 is attracted inward, and each chuck pin 220 enters the closed state. Thus, with the bevel portion 1 (FIG. 5) of the substrate W in contact with the plurality of auxiliary pins 290, the bevel portions 1, 2 (FIG. 5) of the substrate W are held by the holder 223 of each chuck pin 220. Thereafter, the plurality of holding pins 354 are moved to positions outward of the spin chuck 200.

Figure 10B:
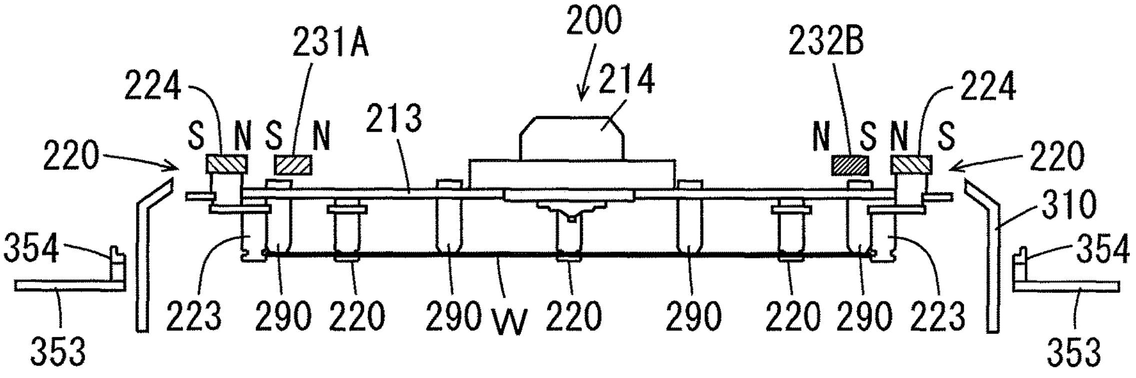

Next, as shown in FIG. 10B, the guard 310 is moved to the height at which the substrate W held by the chuck pins 220 is surrounded by the guard 310. In this state, the cleaning of the upper surface of the substrate W is started.

Figure 11:
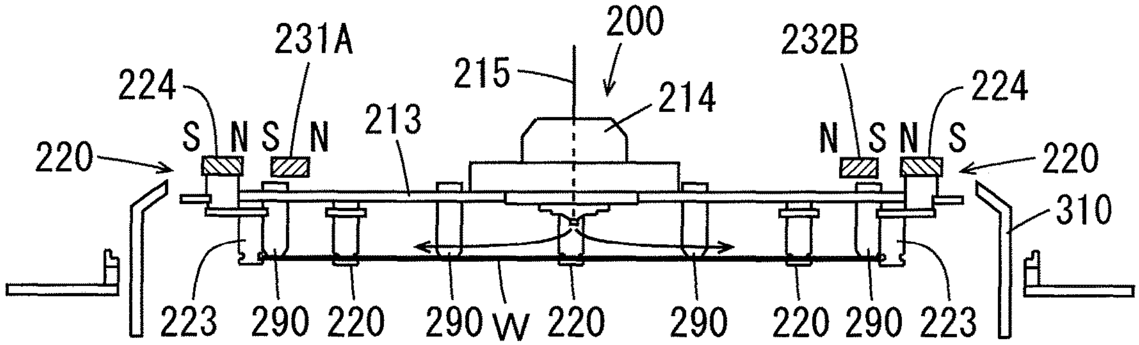
FIG. 11 is a side view for explaining cleaning of an upper surface of the substrate.

FIG. 11 is a side view for explaining the cleaning of the upper surface of the substrate W. As shown in FIG. 11, when the upper surface of the substrate W is cleaned, the cleaning liquid is supplied to the upper surface of the substrate W through the liquid supply pipe 215 with the substrate W rotated by the spin chuck 200. The cleaning liquid spreads to the entire upper surface of the substrate W by a centrifugal force and is splashed outward. Thus, particles or the like adhering to the upper surface of the substrate W are cleaned away.

Figure 12:
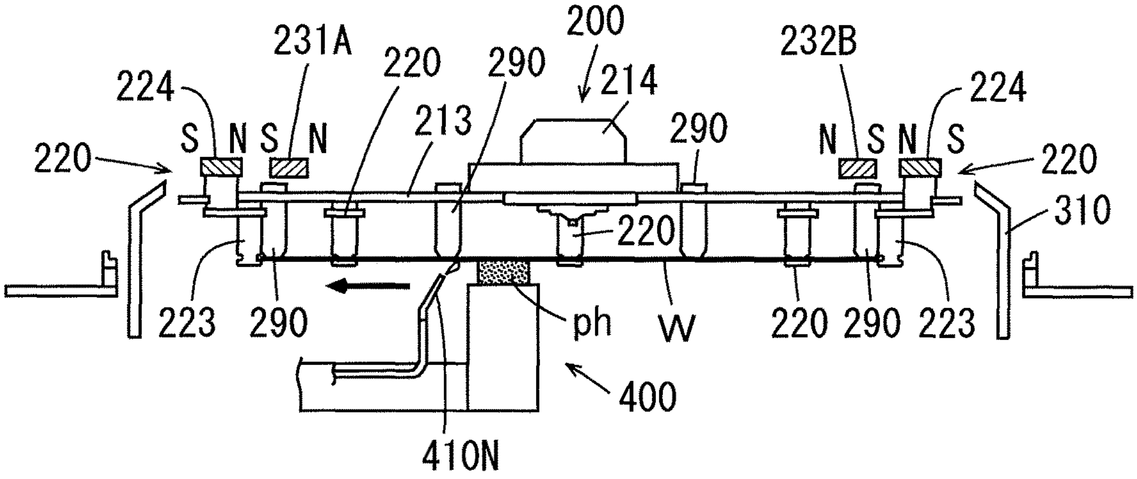
FIG. 12 is a side view for explaining polishing of a lower surface of the substrate.

FIG. 12 is a side view for explaining the polishing of the lower surface of the substrate W. When the lower surface of the substrate W is polished, the cleaning liquid is discharged from the nozzle 410N of the substrate polishing mechanism 400 with the substrate W rotated by the spin chuck 200. Further, the polishing head ph of the substrate polishing mechanism 400 is moved from the head waiting position p1 of FIG. 1 to a position opposite to the center portion of the lower surface of the substrate W, and the polishing head ph is lifted until the upper end surface comes into contact with the lower surface of the substrate W. The upper end surface of the polishing head ph comes into contact with the substrate W, and the polishing head ph pushes the lower surface of the substrate W. In this state, as indicated by a thick arrow in FIG. 12, the polishing head ph is moved from the center portion of the lower surface to the peripheral portion of the lower surface of the substrate W. At this time, the polishing head ph is rotated about the central axis. In this manner, the lower surface of the substrate W is polished by the polishing head ph. The lower surface of the substrate W is polished, and then the polishing head ph is moved to a predetermined height lower than the substrate W and moved to the head waiting position p1 of FIG. 1.

When the peripheral portion of the lower surface of the substrate W is polished by the polishing head ph, the polishing head ph may interfere with the plurality of chuck pins 220. Then, in the present example, when the polishing head ph reaches the peripheral portion of the lower surface of the substrate W, the magnet plate 232A of FIG. 7 is moved from the lower position to the upper position by the magnet lifting lowering mechanism 234A of FIG. 7. Thus, each chuck pin 220 locally enters the opened state in a region corresponding to the magnet plate 232A of the plurality of magnet plates 231A, 231B, 232A, 232B. In this case, because the magnet plate 232A is located above the moving path of the polishing head ph, the polishing head ph is prevented from interfering with the plurality of chuck pins 220.

The polishing of the lower surface of the substrate W by the polishing head ph is controlled based on the removal information stored in the removal information storage 785 (FIG. 8). Thus, the capacity for removing contaminants by the polishing head ph is adjusted according to a position in the radial direction of the substrate W. A specific polishing example based on the removal information will be described below.

After the polishing of the peripheral portion of the lower surface of the substrate W by the polishing head ph, the magnet plate 232A of FIG. 7 is moved from the upper position to the lower position. Thus, the substrate W is held by all of the chuck pins 220.

Figure 13:
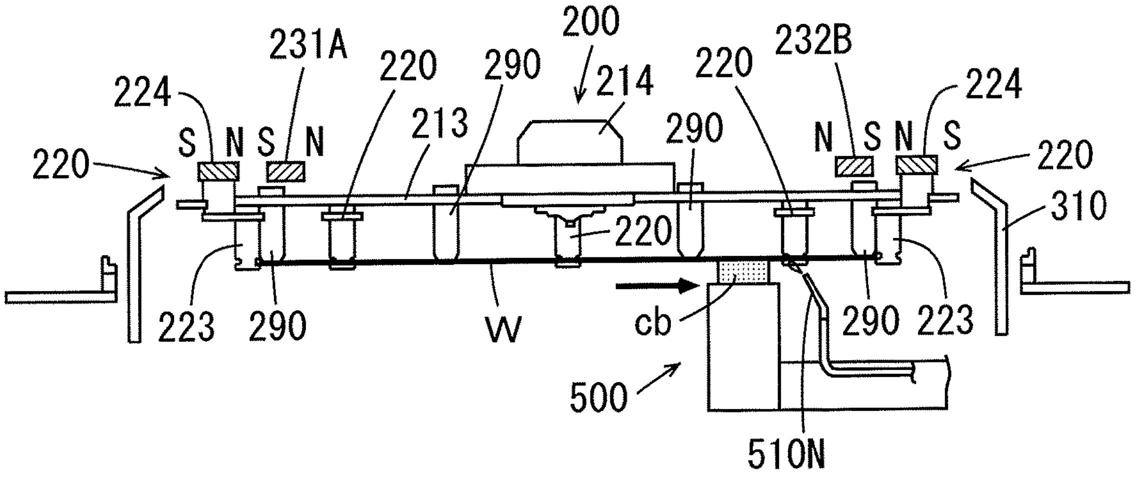
FIG. 13 is a side view for explaining cleaning of the lower surface of the substrate.

FIG. 13 is a side view for explaining the cleaning of the lower surface of the substrate W. When the lower surface of the substrate W is cleaned, the cleaning liquid is discharged from the nozzle 510N of the substrate cleaning mechanism 500 with the substrate W rotated by the spin chuck 200. Further, the cleaning brush cb of the substrate cleaning mechanism 500 is moved from the brush waiting position p2 of FIG. 1 to a position opposite to the center portion of the lower surface of the substrate W, and the cleaning brush cb is lifted until the upper end surface comes into contact with the lower surface of the substrate W. The upper end surface of the cleaning brush cb comes into contact with the substrate W, and the cleaning brush cb pushes the lower surface of the substrate W at a predetermined pressure. In this state, as indicated by a thick arrow in FIG. 13, the cleaning brush cb is moved from the center portion of the lower surface of the substrate W to the peripheral portion of the lower surface of the substrate W. At this time, the cleaning brush cb may be rotated about its central axis, or does not have to be rotated. In this manner, the lower surface of the substrate W is cleaned by the cleaning brush cb. Thus, contaminants stripped off the substrate W during the polishing of the lower surface of the substrate W are physically removed and cleaned away. After the cleaning of the lower surface of the substrate W, the cleaning brush cb is moved to a predetermined height lower than the substrate W and is moved to the brush waiting position p2 of FIG. 1.

When the peripheral portion of the lower surface of the substrate W is cleaned by the cleaning brush cb, the cleaning brush cb may interfere with the plurality of chuck pins 220. Then, in the present example, when the cleaning brush cb reaches the peripheral portion of the lower surface of the substrate W, the magnet plate 232B of FIG. 7 is moved from the lower position to the upper position by the magnet lifting lowering mechanism 234B of FIG. 7. Thus, each chuck pin 220 locally enters the opened state in a region corresponding to the magnet plate 232B of the plurality of magnet plates 231A, 231B, 232A, 232B. In this case, because the magnet plate 232B is located above the moving path of the cleaning brush cb, the cleaning brush cb is prevented from interfering with the plurality of chuck pins 220.

After the cleaning of the peripheral portion of the lower surface of the substrate W by the cleaning brush cb, the magnet plate 232B of FIG. 7 is moved from the upper position to the lower position. Thus, the substrate W is held by all of the chuck pins 220.

As described above, when the peripheral portion of the lower surface of the substrate W is polished and cleaned, one of the chuck pins 220 is spaced apart from the outer peripheral end WE of the substrate W. At this time, the outer peripheral end WE of the substrate W in the vicinity of the one chuck pin 220 is not held by the one chuck pin 220. Even in this state, the two auxiliary pins 290 adjacent to the one chuck pin 220 abut against the bevel portion 1 of the substrate W, and generate a reaction force in the substrate W against a pushing force applied from the polishing head ph or the cleaning brush cb to the substrate W. Therefore, deflection of the substrate W is prevented.

The cleaning processing for the upper surface of the substrate W, the polishing processing for the lower surface of the substrate W and the cleaning processing for the lower surface of the substrate W are performed, and then the drying processing for the substrate W is performed. In this case, with the substrate W held by all of the chuck pins 220, the substrate W is rotated at a high speed. Thus, the cleaning liquid adhering to the substrate W is shaken off, and the substrate W is dried.

During the drying processing for the substrate W, gas such as an inert gas (a nitrogen gas, for example) or air may be supplied to the substrate W through the liquid supply pipe 215. In this case, the cleaning liquid on the substrate W is blown off outward by an air stream formed between the spin plate 213 and the substrate W. Thus, the substrate W can be efficiently dried.

When the drying processing for the substrate W ends, the substrate W is carried out from the casing 710 in the reverse steps of the above-mentioned steps for carrying in the substrate W.

(6) Details of Removal Information and Polishing of Lower Surface of Substrate

During the polishing of the substrate W, an uncontaminated region of the lower surface of the substrate W is polished with no removal of contaminants, so that the region is likely to be excessively polished. On the other hand, a contaminated region of the lower surface of the substrate W is polished while contaminants are removed, so that the region is unlikely to be polished. Therefore, when the contaminated portion and the uncontaminated portion are polished with the capacity for removing contaminants by the polishing head ph maintained constant, differences in surface condition are generated in a plurality of portions of the lower surface of the polished substrate W. For example, a surface of the substrate W is excessively scraped in a region having a low degree of contamination, and a surface of the substrate W is hardly scraped in a region having a high degree of contamination. Thus, the lower surface of the polished substrate W is non-uniform.

The distribution of contaminants on the lower surface of the substrate W that is carried into the substrate cleaning device 700 can be presumed based on contents of processing performed on the substrate W, a method of transporting the substrate W and a method of storing the substrate W. Then, in the present embodiment, the removal information, indicating the capacity for removing contaminants to be set according to a position in the radial direction of the substrate W in order for the lower surface condition of the polished substrate W to be uniform, is stored in the removal information storage 785 of FIG. 8 based on the distribution of contaminants presumably generated on the lower surface of the substrate W.

Figure 14:
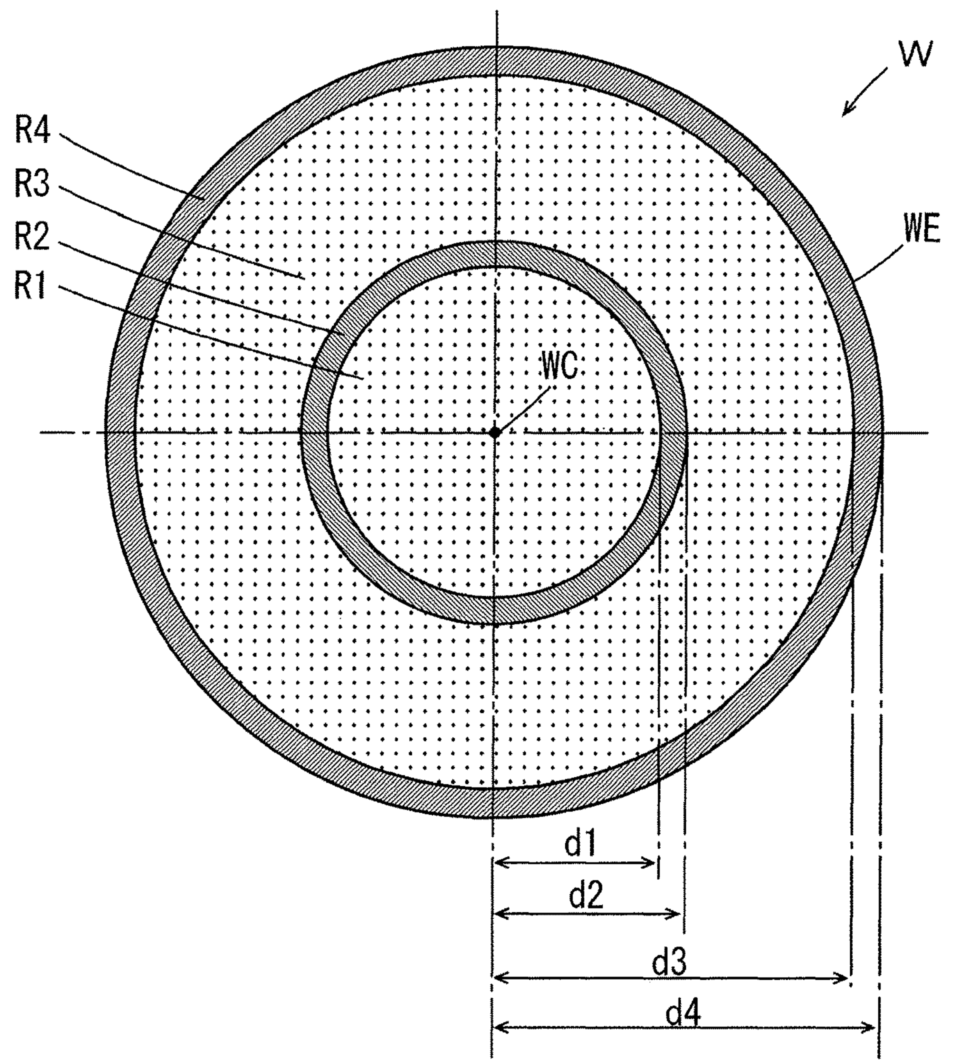
FIG. 14 is a diagram showing one example of distribution of contaminants presumably generated on the lower surface of the substrate.

FIG. 14 is a diagram showing one example of the distribution of contaminants presumably generated on the lower surface of the substrate W. In the example of FIG. 14, the distribution of contaminants presumably generated on the lower surface of the substrate W is indicated by first to fourth regions R1 to R4 having a circular shape or an annular shape.

The first region R1 is circular and located at the center of the substrate W. The second region R2 is annular and surrounds the first region R1. The third region R3 is annular and surrounds the second region R2. The fourth region R4 is annular and surrounds the third region R3. In FIG. 14, a common dotted pattern is applied to the first and third regions R1, R3. Further, different types of hatching are applied to the second and fourth regions R2, R4. Outer edges of the first to fourth regions R1 to R4 are arranged to be concentric about a center WC of the substrate W.

The second region R2 of the first to fourth regions R1 to R4 is located at a substantially middle position between the center WC and the outer peripheral end WE in the radial direction of the substrate W. It is presumed that suction marks are likely to be generated in the second region R2 when the lower surface of the substrate W is held by suction by the below-mentioned spin chucks 25, 35 (FIG. 20), for example. Further, it is presumed that contact marks are likely to be generated in the second region R2 when the lower surface of the substrate W is supported by a plurality of lifting lowering pins (not shown), for example.

On the other hand, the fourth region R4 of the first to fourth regions R1 to R4 is located at the peripheral portion of the lower surface of the substrate W. It is presumed that, when a processing liquid for a resist film, a processing liquid for a resist cover film, described below, or the like is supplied to the upper surface of the substrate W, for example, part of the processing liquid is likely to firmly adhere to the fourth region R4 as contaminants. Further, it is presumed that contact marks are likely to be generated in the fourth region R4 because the substrate W is stored in a below-mentioned carrier 113 (FIG. 19), for example. Further, it is presumed that contact marks are likely to be generated in the fourth region R4 because the substrate W is held by a below-mentioned transport device 115 (FIG. 19) and the like, for example.

As described above, the contamination of the lower surface of the substrate W includes the contamination caused by suction marks and contact marks, and the contamination caused by the adherence of the processing liquid. As for the contamination caused by the adherence of the processing liquid of these two types of contamination, the processing liquid may cumulatively adhere to the substrate W. Thus, it is considered that a degree of contamination is high as compared to the contamination caused by suction marks and contact marks. Thus, it is presumed that a medium degree of contamination caused by suction marks and contact marks is present in the second region R2, and it is presumed that a high degree of contamination caused by contact marks and the processing liquid is present in the fourth region R4.

On the other hand, it is unlikely that another member comes into contact with or contaminants adhere to the first and third regions R1, R3 of the first to fourth regions R1 to R4. Therefore, it is presumed that the first and third regions R1, R3 are hardly contaminated and clean.

It is possible to adjust the capacity for removing contaminants by the polishing head ph by controlling at least one of the pushing force exerted on the lower surface of the substrate W from the polishing head ph, the moving speed of the polishing head ph, the rotation speed of the polishing head ph and the rotation speed of the substrate W. In the case where the removal information corresponding to the distribution of contaminants of FIG. 14 is stored in the removal information storage 785 (FIG. 8), the polishing controller 790 (FIG. 8) controls the substrate polishing mechanism 400 or the spin chuck 200 as described below, for example.

In the following description, as shown in FIG. 14, a distance from the center WC of the substrate W to an outer edge (an inner edge of the second region R2) of the first region R1 is d1, and a distance from the center WC of the substrate W to an outer edge (an inner edge of the third region R3) of the second region R2 is d2. Further, a distance from the center WC of the substrate W to an outer edge of the third region R3 (an inner edge of the fourth region R4) is d3, and a distance from the center WC of the substrate W to an outer edge of the fourth region R4 (the outer peripheral end WE of the substrate W) is d4.

Figure 15:
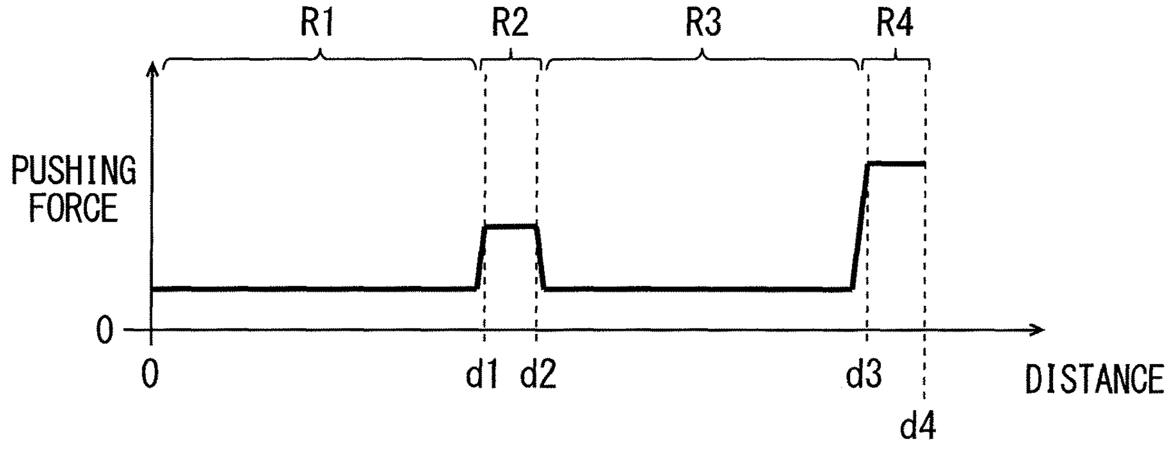
FIG. 15 is a diagram showing one control example of a substrate polishing mechanism based on removal information corresponding to the distribution of contaminants of FIG. 14.

FIG. 15 is a diagram showing one control example of the substrate polishing mechanism 400 based on the removal information corresponding to the distribution of contaminants of FIG. 14. In FIG. 15, a relationship between the pushing force exerted on the lower surface of the substrate W from the polishing head ph and a position of the polishing head ph on the lower surface of the substrate W is indicated by a graph. In the graph of FIG. 15, the ordinate indicates the pushing force exerted on the lower surface of the substrate W from the polishing head ph, and the abscissa indicates a distance from the center WC of the substrate W to a portion, closest to the outer peripheral end WE of the substrate W, of the polishing head ph, that is, a position of the polishing head ph in the radial direction of the substrate W. The pushing force exerted on the lower surface of the substrate W from the polishing head ph is adjusted by the control of the electric pneumatic regulator 433 of FIG. 8 by the lifting lowering controller 792 of FIG. 8.

The larger the pushing force exerted on the lower surface of the substrate W from the polishing head ph is, the higher the removing capacity is. The smaller the pushing force exerted on the lower surface of the substrate W from the polishing head ph is, the smaller the removing capacity is. Then, in the example of FIG. 15, when the polishing head ph is located in each of the first and third region R1, R3, that is, when the distance from the center WC of the substrate W to the position of the polishing head ph is between the distance 0 and the distance d1, and between the distance d2 and the distance d3, the pushing force exerted on the lower surface of the substrate W from the polishing head ph is maintained at a certain value close to 0. Thus, the first and third region R1, R3 are prevented from being excessively polished by the polishing head ph.

Further, when the polishing head ph is located in the second region R2, that is, when the distance from the center WC of the substrate W to the position of the polishing head ph is between the distance d1 and the distance d2, the pushing force exerted on the lower surface of the substrate W from the polishing head ph is adjusted to be larger than the pushing force corresponding to each of the first and third regions R1, R3. In the present example, the pushing force corresponding to the second region R2 is set about twice of the pushing force corresponding to each of the first and third regions R1, R3. Thus, suction marks, contact marks and the like considered to be generated in the second region R2 are appropriately removed by the polishing head ph and with a medium degree of removing capacity. At this time, the second region R2 is polished to the same extent as the first and third regions R1, R3.

Further, when the polishing head ph is located in the fourth region R4, that is, when the distance from the center WC of the substrate W to the position of the polishing head ph is between the distance d3 and the distance d4, the pushing force exerted on the lower surface of the substrate W from the polishing head ph is adjusted to be larger than any of the pushing forces corresponding to the first, second and third regions R1, R2, R3. In the present example, the pushing force corresponding to the fourth region R4 is set about three times of the pushing force corresponding to each of the first and third regions R1, R3. Thus, suction marks and contact marks considered to be generated in the fourth region R4, and contaminants such as the processing liquid firmly adhering to the fourth region R4 are appropriately removed by the polishing head ph and with a high degree of removing capacity. At this time, the fourth region R4 is polished to the same extent as the first and third regions R1, R3.

In the present example, the pushing force corresponding to a position in the radial direction of the substrate W may be stored in advance in the removal information storage 785 of FIG. 8 as the removal information.

Further, in the present example, a detector (a load cell and the like) for detecting the pushing force may be provided in the substrate polishing mechanism 400 in order for the pushing force exerted on the lower surface of the substrate W from the polishing head ph to be more accurately controlled. In this case, the lifting lowering controller 792 of FIG. 8 may control the pushing force based on the detection of the detector by the feedback control.

Figure 16:
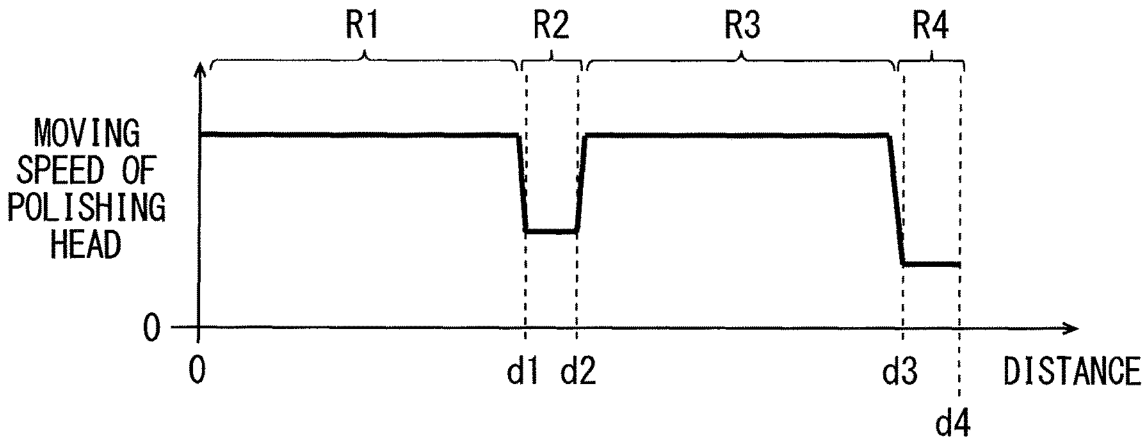
FIG. 16 is a diagram showing another control example of the substrate polishing mechanism based on the removal information corresponding to the distribution of contaminants of FIG. 14.

FIG. 16 is a diagram showing another control example of the substrate polishing mechanism 400 based on the removal information corresponding to the distribution of contaminants of FIG. 14. In FIG. 16, a relationship between the moving speed of the polishing head ph in the radial direction of the substrate W and the position of the polishing head ph on the lower surface of the substrate W is indicated by a graph. In the graph of FIG. 16, the ordinate indicates a moving speed of the polishing head ph in the radial direction of the substrate W, and the abscissa indicates a distance from the center WC of the substrate W to the portion, closest to the peripheral end WE of the substrate W, of the polishing head ph, that is, the position of the polishing head ph in the radial direction of the substrate W. The moving speed of the polishing head ph in the radial direction of the substrate W is adjusted by the control of the arm rotation driver 440 of FIG. 8 by the arm controller 793 of FIG. 8.

In a region, where the moving speed of the polishing head ph is low, of the lower surface of the substrate W, a contact time period of the polishing head ph is increased, so that the removing capacity is enhanced. On the other hand, in a region, where the moving speed of the polishing head ph is high, of the lower surface of the substrate W, the contact time period of the polishing head ph is reduced, so that the removing capacity is degraded. Then, in the example of FIG. 16, when the polishing head ph is located in each of the first and third regions R1, R3, that is, when the distance from the center WC of the substrate W to the position of the polishing head ph is between the distance 0 and the distance d1, and between the distance d2 and the distance d3, the moving speed of the polishing head ph is maintained at a relatively high certain value. Thus, the first and third regions R1, R3 are prevented from being excessively polished by the polishing head ph.

Further, when the polishing head ph is located in the second region R2, that is, when the distance from the center WC of the substrate W to the position of the polishing head ph is between the distance d1 and the distance d2, the moving speed of the polishing head ph is adjusted to be lower than the moving speed corresponding to each of the first and third regions R1, R3. In the present example, the moving speed corresponding to the second region R2 is set to about ½ of the moving speed corresponding to each of the first and third regions R1, R3. Thus, suction marks, contact marks and the like considered to be generated in the second region R2 are appropriately removed by the polishing head ph and with a medium degree of removing capacity. At this time, the second region R2 is polished to the same extent as the first and third regions R1, R3.

Further, when the polishing head ph is located in the fourth region R4, that is, when the distance from the center WC of the substrate W to the position of the polishing head ph is between the distance d3 and the distance d4, the moving speed of the polishing head ph is adjusted to be lower than any of the moving speeds corresponding to the first, second and third regions R1, R2, R3 and maintained at a value close to 0. In the present example, the moving speed corresponding to the fourth region R4 is set to about ⅓ of the moving speed corresponding to each of the first and third regions R1, R3. Thus, suction marks and contact marks considered to be generated in the fourth region R4, and contaminants such as the processing liquid firmly adhering to the fourth region R4 are appropriately removed by the polishing head ph and with a high degree of removal capacity. At this time, the fourth region R4 is polished to the same extent as the first and third regions R1, R3.

In the present example, the moving speed of the polishing head ph corresponding to the position in the radial direction of the substrate W may be stored in advance in the removal information storage 785 of FIG. 8 as the removal information.

Figure 17:
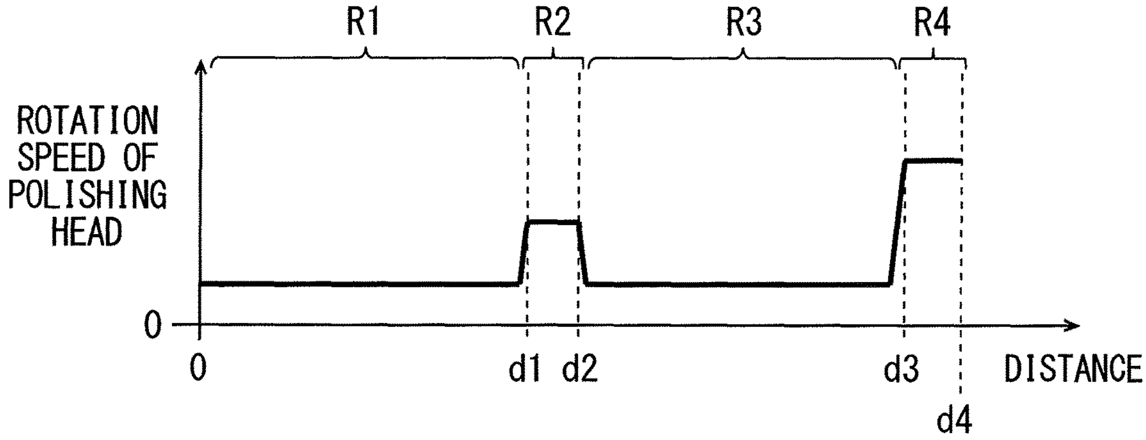
FIG. 17 is a diagram showing yet another control example of the substrate polishing mechanism based on the removal information corresponding to the distribution of contaminants of FIG. 14.

FIG. 17 is a diagram showing yet another control example of the substrate polishing mechanism 400 based on the removal information corresponding to the distribution of contaminants of FIG. 14. In FIG. 17, a relationship between the rotation speed of the polishing head ph rotated about the central axis of the polishing head ph and the position of the polishing head ph on the lower surface of the substrate W is indicated by a graph. In the graph of FIG. 17, the ordinate indicates the rotation speed of the polishing head ph, and the abscissa indicates a distance from the center WC of the substrate W to a portion, closest to the outer peripheral end WE of the substrate W, of the polishing head ph, that is, the position of the polishing head ph in the radial direction of the substrate W. The rotation speed of the polishing head ph is adjusted by the control of the motor 418 of FIG. 8 by the rotation controller 791 of FIG. 8.

The higher the rotation speed of the polishing head ph is, the higher the removing capacity is, and the lower the rotation speed of the polishing head ph is, the lower the removing capacity is. Then, in the example of FIG. 17, when the polishing head ph is located in each of the first and third regions R1, R3, that is, when the distance from the center WC of the substrate W to the position of the polishing head ph is between the distance 0 and the distance d1, and between the distance d2 and the distance d3, the rotation speed of the polishing head ph is maintained at a certain value close to 0. Thus, the first and third regions R1, R3 are prevented from being excessively polished by the polishing head ph.

Further, when the polishing head ph is located in the second region R2, that is, when the distance from the center WC of the substrate W to the position of the polishing head ph is between the distance d1 and the distance d2, the rotation speed of the polishing head ph is adjusted to be higher than the rotation speed of the polishing head ph corresponding to each of the first and third regions R1, R3. In the present example, the rotation speed of the polishing head ph corresponding to the second region R2 is set to about twice of the rotation speed of the polishing head ph corresponding to each of the first and third regions R1, R3. Thus, suction marks, contact marks and the like considered to be generated in the second region R2 are appropriately removed by the polishing head ph and with a medium degree of removing capacity. At this time, the second region R2 is polished to the same extent as the first and third regions R1, R3.

Further, when the polishing head ph is located in the fourth region R4, that is, when the distance from the center WC of the substrate W to the position of the polishing head ph is between the distance d3 and the distance d4, the rotation speed of the polishing head ph is adjusted to be higher than any of the rotation speeds corresponding to the first, second and third regions R1, R2, R3. In the present example, the rotation speed of the polishing head ph corresponding to the fourth region R4 is set to about 3 times of the rotation speed of the polishing head ph corresponding to each of the first and third regions R1, R3. Thus, suction marks and contact marks considered to be generated in the fourth region R4 and contaminants such as the processing liquid firmly adhering to the fourth region R4 are appropriately removed by the polishing head ph and with a high degree of removing capacity. At this time, the fourth region R4 is polished to the same extent as the first and third regions R1, R3.

In the present example, the rotation speed of the polishing head ph corresponding to the position in the radial direction of the substrate W may be stored in advance in the removal information storage 785 of FIG. 8 as the removal information.

Figure 18:
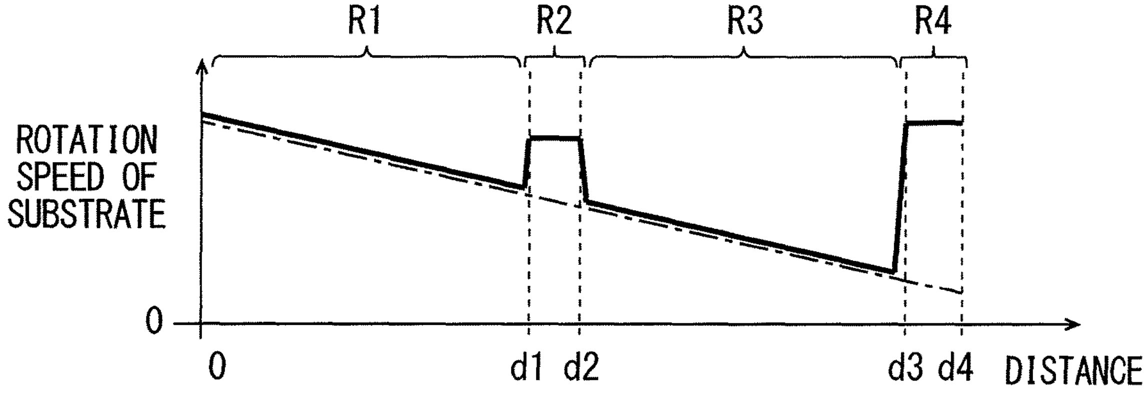
FIG. 18 is a diagram showing one control example of a spin chuck based on the removal information corresponding to the distribution of contaminants of FIG. 14.

FIG. 18 is a diagram showing one control example of the spin chuck 200 based on the removal information corresponding to the distribution of contaminants of FIG. 14. In FIG. 18, a relationship between the rotation speed of the substrate W rotated by the spin chuck 200 and the position of the polishing head ph on the lower surface of the substrate W is indicated by a graph. In the graph of FIG. 18, the ordinate indicates the rotation speed of the substrate W, and the abscissa indicates the distance from the center WC of the substrate W to the portion, closest to the outer peripheral end WE of the substrate W, of the polishing head ph, that is, the position of the polishing head ph in the radial direction of the substrate W. The rotation speed of the substrate W is adjusted by the control of the spin chuck 200 of FIG. 8 by the spin chuck controller 781 of FIG. 8.

The removing capacity is determined according to a relative speed difference between the polishing head ph and a portion, being in contact with the polishing head ph, of the substrate W in a circumferential direction of the substrate W. Specifically, the larger the speed difference between the polishing head ph and the portion, being in contact with the polishing head ph, of the substrate W is, the higher the removing capacity is. Further, the smaller the speed difference is, the lower the removing capacity is.

Basically, in the case where the substrate W is rotated at a constant rotation speed, the above-mentioned speed difference increases at a constant rate as the polishing head ph approaches the outer peripheral end WE of the substrate W from the center WC of the substrate W. Therefore, as indicated by a one-dot and dash line in FIG. 18, in the case where the entire lower surface of the substrate W is polished by uniform removing capacity, the rotation speed of the substrate W is adjusted to continuously decrease at a constant rate as the polishing head ph approaches the outer peripheral end WE of the substrate W from the center WC of the substrate W.

In the example of FIG. 18, when the polishing head ph is located in each of the first region R1 and the third region R3, that is, when the distance from the center WC of the substrate W to the position of the polishing head ph is between the distance 0 and the distance d1, and between the distance d2 and the distance d3, the rotation speed of the substrate W is adjusted such that the above-mentioned speed difference is maintained at a constant value. Thus, the first and third regions R1, R3 are prevented from being non-uniformly polished by the polishing head ph.

Further, when the polishing head ph is located in the second region R2, that is, when the distance from the center WC of the substrate W to the position of the polishing head ph is between the distance d1 and the distance d2, the rotation speed of the substrate W is adjusted such that the above-mentioned speed difference is larger than the speed difference corresponding to each of the first and third regions R1, R3. Thus, suction marks, contact marks and the like considered to be generated in the second region R2 are appropriately removed by the polishing head ph and with a medium degree of removing capacity. At this time, the second region R2 is polished to the same extent as the first and third regions R1, R3.

Further, when the polishing head ph is located in the fourth region R4, that is, the distance from the center WC of the substrate W to the position of the polishing head ph is between the distance d3 and the distance d4, the rotation speed of the substrate W is adjusted such that the above-mentioned speed difference is larger than any of the speed differences corresponding to the first, second and third regions R1, R2, R3. Thus, suction marks and contact marks considered to be generated in the fourth region R4 and contaminants such as the processing liquid firmly adhering to the fourth region R4 are appropriately removed by the polishing head ph and with a high degree of removing capacity. At this time, the fourth region R4 is polished to the same extent as the first and third regions R1, R3.

In the present example, the rotation speed of the substrate W corresponding to the position in the radial direction of the substrate W may be stored in advance in the removal information storage 785 of FIG. 8 as the removal information.

As described above, in the substrate cleaning device 700 according to the present embodiment, the lower surface of the substrate W is polished by the polishing head ph and with the removing capacity corresponding to the position in the radial direction of the substrate W based on the removal information corresponding to the presumed distribution of contaminants. Therefore, contaminants of the lower surface of the substrate W can be appropriately removed while the lower surface of the substrate W is prevented from being non-uniformly polished.

As described above, a degree of capacity for removing contaminants by the polishing head ph changes depending on the pushing force exerted on the lower surface of the substrate W from the polishing head ph, the moving speed of the polishing head ph, the rotation speed of the polishing head ph and the rotation speed of the substrate W. Therefore, the removing capacity may be adjusted by one element of the pushing force exerted on the lower surface of the substrate W from the polishing head ph, the moving speed of the polishing head ph, the rotation speed of the polishing head ph and the rotation speed of the substrate W, or may be adjusted by combination of a plurality of elements.

In the case where the removing capacity is adjusted by any of the pushing force, the moving speed and the rotation speed of the polishing head ph, the rotation speed of the substrate W is preferably adjusted such that the rotation speed of the substrate W decreases as the polishing head ph approaches the outer peripheral end WE from the center WC of the substrate W, as indicated by a one-dot and dash line in FIG. 18.

(7) Substrate Processing Apparatus

Figure 19:
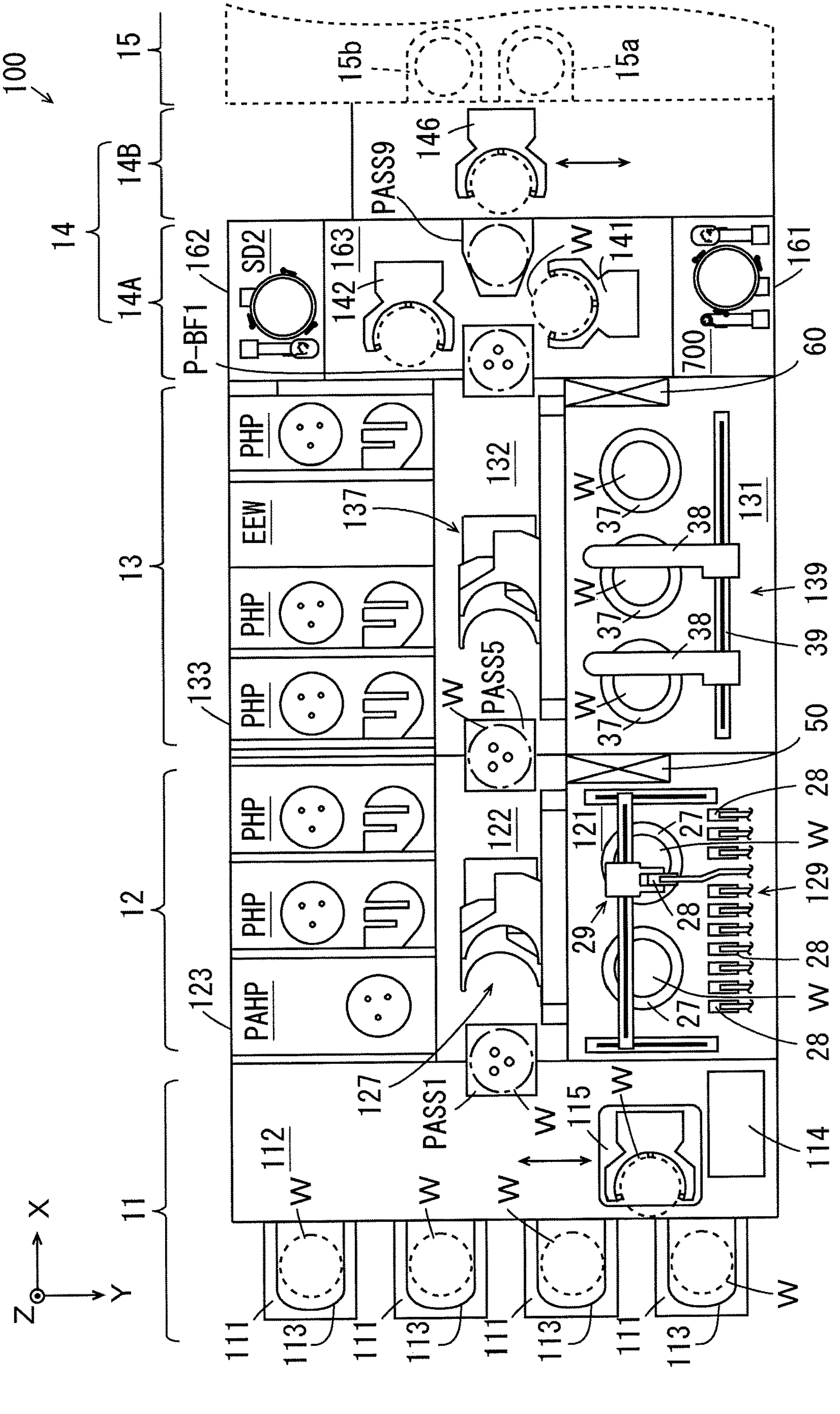
FIG. 19 is a schematic plan view of a substrate processing apparatus including the substrate cleaning device of FIG. 1.
Figure 20:
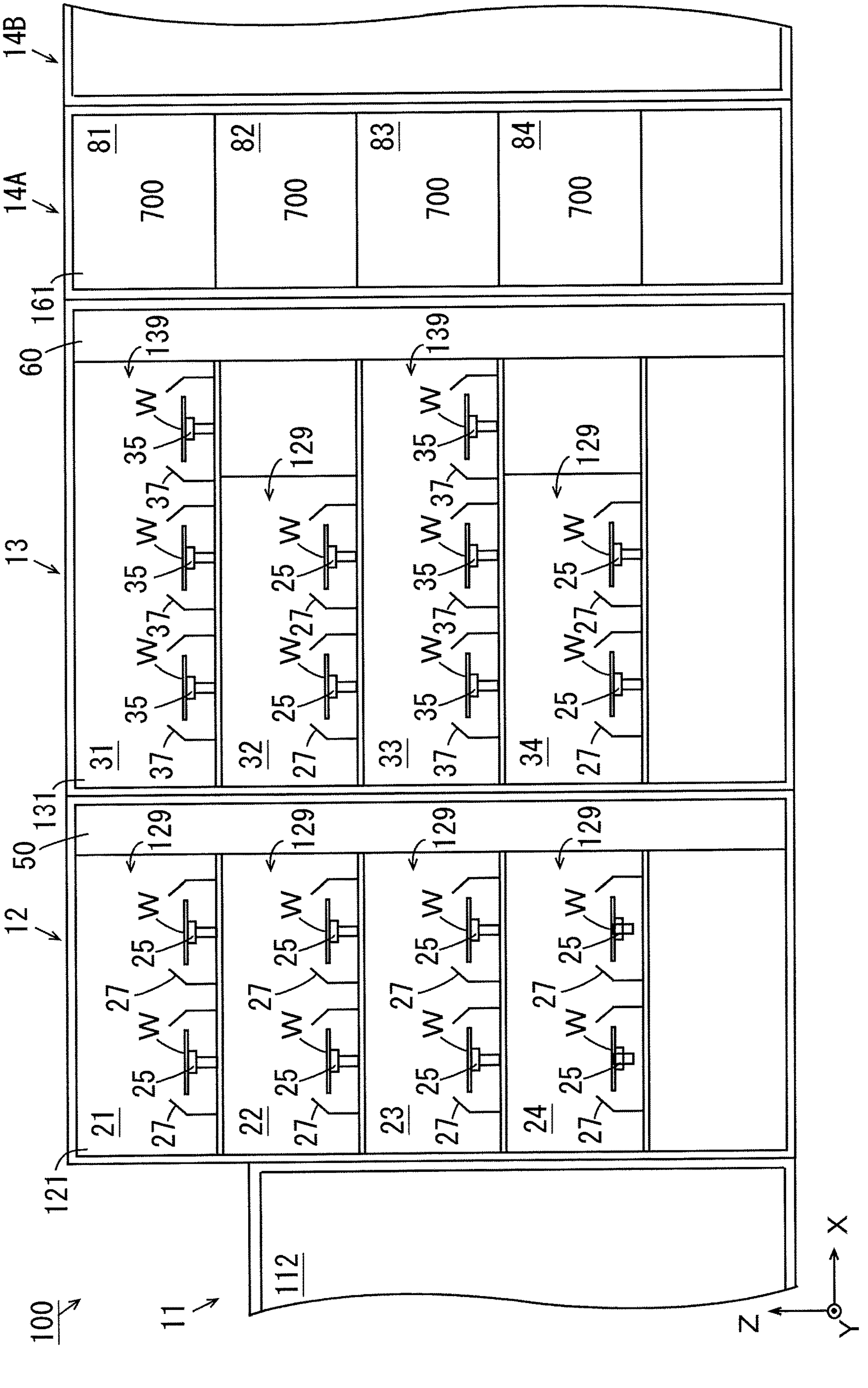
FIG. 20 is a schematic side view of the substrate processing apparatus mainly showing a coating processing section, a coating development processing section and a cleaning drying processing section of FIG. 19.
Figure 21:
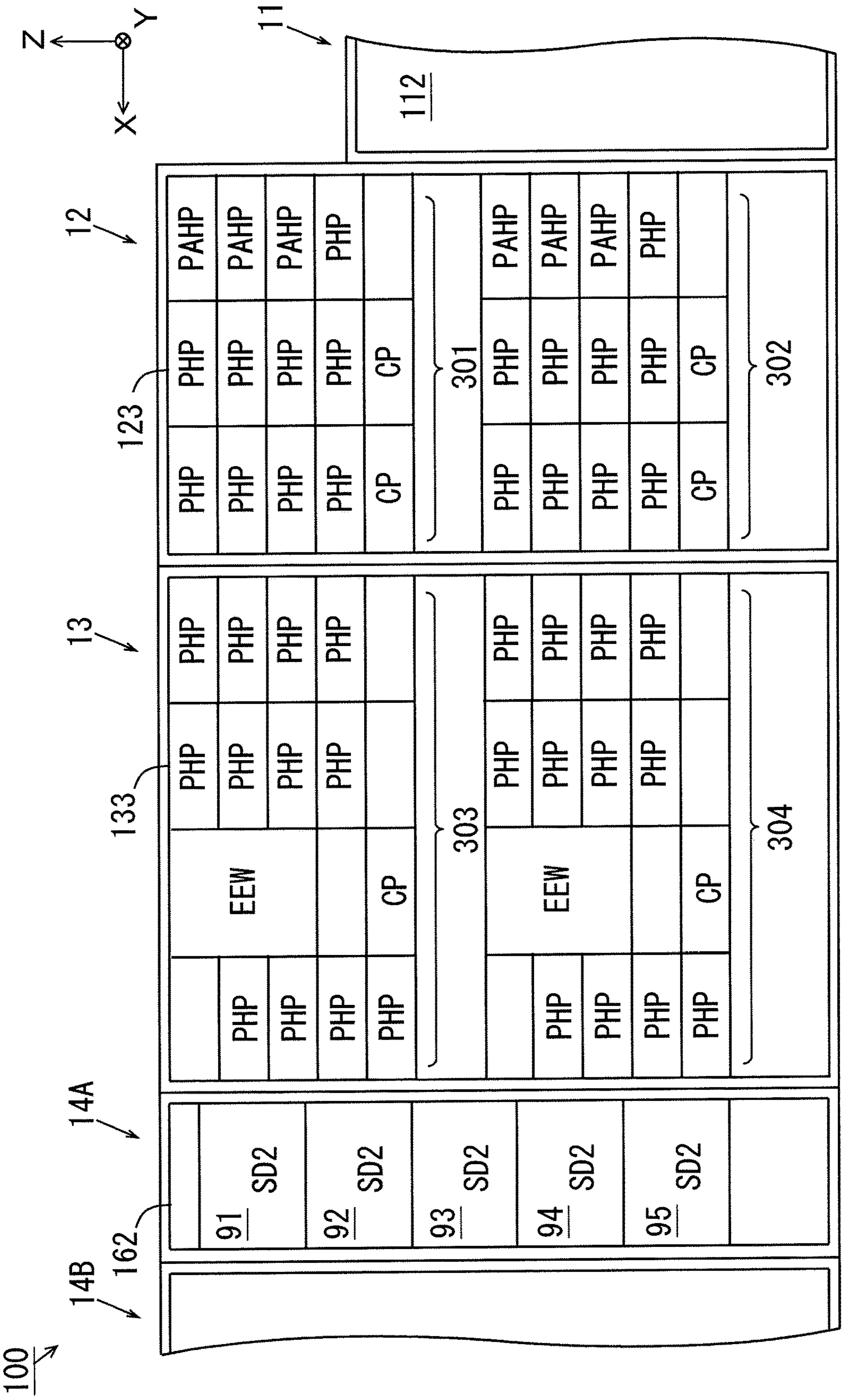
FIG. 21 is a schematic side view of the substrate processing apparatus mainly showing thermal processing sections and the cleaning drying processing section of FIG. 19.
Figure 22:
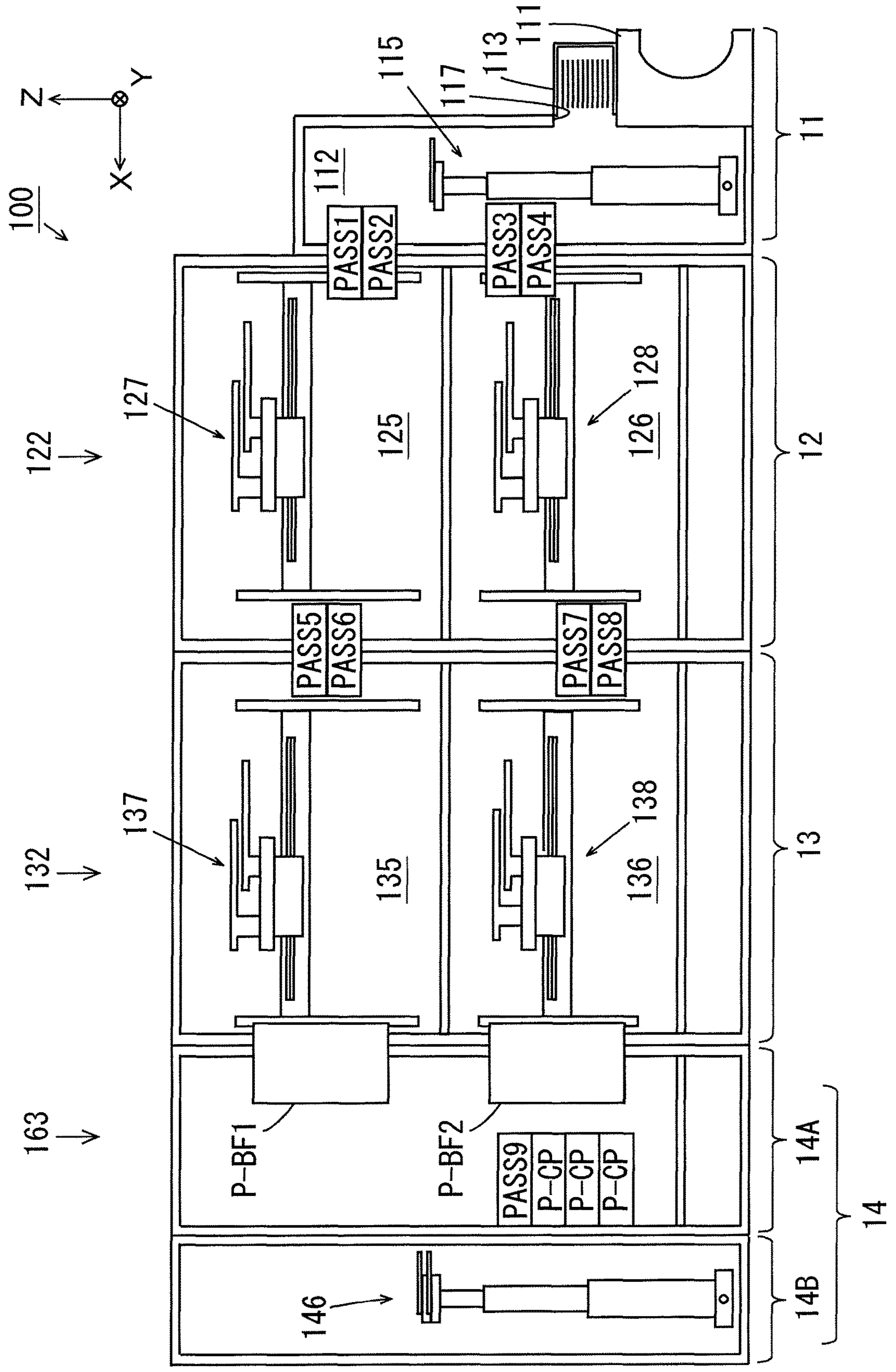
FIG. 22 is a side view mainly showing transport sections of FIG. 19.

FIG. 19 is a schematic plan view of the substrate processing apparatus 100 including the substrate cleaning device 700 of FIG. 1. FIG. 19 and the subsequent given drawings FIGS. 20 to 22 are accompanied by the arrows that indicate X, Y and Z directions orthogonal to one another for the clarity of a positional relationship. The X and Y directions are orthogonal to each other within a horizontal plane, and the Z direction corresponds to a vertical direction.

As shown in FIG. 19, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on the substrate W using a liquid immersion method.

The indexer block 11 includes a plurality of carrier platforms 111 and a transport section 112. In each carrier platform 111, a carrier 113 for storing the plurality of substrates W in multiple stages is placed.

In the transport section 112, a main controller 114 and a transport device 115 are provided. The main controller 114 controls various constituent elements of the substrate processing apparatus 100. The transport device 115 holds and transports the substrate W.

The first processing block 12 includes a coating processing section 121, a transport section 122 and a thermal processing section 123. The coating processing section 121 and the thermal processing section 123 are provided to be opposite to each other with the transport section 122 interposed therebetween. A substrate platform PASS1 and below-mentioned substrate platforms PASS2 to PASS4 (see FIG. 22) on which the substrates W are placed are provided between the transport section 122 and the indexer block 11. A transport device 127 and a below-mentioned transport device 128 (see FIG. 22), which transport the substrates W, are provided in the transport section 122.

The second processing block 13 includes a coating development processing section 131, a transport section 132 and a thermal processing section 133. The coating development processing section 131 and the thermal processing section 133 are provided to be opposite to each other with the transport section 132 interposed therebetween. A substrate platform PASS5 and below-mentioned substrate platforms PASS6 to PASS8 (see FIG. 22) on which the substrates W are placed, are provided between the transport section 132 and the transport section 122. A transport device 137 and a below-mentioned transport device 138 (see FIG. 22), which transport the substrates W, are provided in the transport section 132.

The cleaning drying processing block 14A includes cleaning drying processing sections 161, 162 and a transport section 163. The cleaning drying processing sections 161, 162 are provided to be opposite to each other with the transport section 163 interposed therebetween. Transport devices 141, 142 are provided in the transport section 163.

A placement buffer unit P-BF1 and a below-mentioned placement buffer unit P-BF2 (see FIG. 22) are provided between the transport section 163 and the transport section 132.

Further, a substrate platform PASS9 and below-mentioned placement cooling units P-CP (see FIG. 22) are provided to be adjacent to the carry-in carry-out block 14B between the transport devices 141, 142.

A transport device 146 is provided in the carry-in carry-out block 14B. The transport device 146 carries in the substrate W to and carries out the substrate W from the exposure device 15. A substrate inlet 15*a* for carrying in the substrate W and a substrate outlet 15*b* for carrying out the substrate W are provided in the exposure device 15.

(8) Configurations of Coating Processing Section and Coating Development Processing Section FIG. 20 is a schematic side view of the substrate processing apparatus 100 mainly showing the coating processing section 121, the coating development processing section 131 and the cleaning drying processing section 161 of FIG. 19.

As shown in FIG. 20, the coating processing section 121 has coating processing chambers 21, 22, 23, 24 provided in a stack. Each of the coating processing chambers 21 to 24 is provided with a coating processing unit (a spin coater) 129. The coating development processing section 131 has development processing chambers 31, 33 and coating processing chambers 32, 34 provided in a stack. Each of the development processing chambers 31, 33 is provided with a development processing unit (a spin developer) 139, and each of the coating processing chambers 32, 34 is provided with the coating processing unit 129.

Each coating processing unit 129 includes spin chucks 25 that hold the substrates W and cups 27 provided to cover the surroundings of the spin chucks 25. In the present embodiment, each coating processing unit 129 is provided with two pairs of the spin chuck 25 and the cup 27. The spin chuck 25 is driven to be rotated by a driving device (an electric motor, for example) that is not shown. Further, as shown in FIG. 19, each coating processing unit 129 includes a plurality of processing liquid nozzles 28 for discharging a processing liquid and a nozzle transport mechanism 29 for transporting the processing liquid nozzles 28.

In the coating processing unit 129, each of the spin chucks 25 is rotated by a driving device (not shown), and any processing liquid nozzle 28 of the plurality of processing liquid nozzles 28 is moved to a position above the substrate W by the nozzle transport mechanism 29, and the processing liquid is discharged from the processing liquid nozzle 28. Thus, the processing liquid is applied onto the substrate W. Further, a rinse liquid is discharged to the peripheral portion of the substrate W from an edge rinse nozzle (not shown). Thus, the processing liquid adhering to the peripheral portion of the substrate W is removed.

In the coating processing unit 129 in each of the coating processing chambers 22, 24, a processing liquid for an anti-reflection film is supplied to the substrate W from the processing liquid nozzle 28. In the coating processing unit 129 in each of the coating processing chambers 21, 23, a processing liquid for a resist film is supplied to the substrate W from the processing liquid nozzle 28. In the coating processing unit 129 in each of the coating processing chambers 32, 34, a processing liquid for a resist cover film is supplied to the substrate W from the processing liquid nozzle 28.

Similarly to the coating processing unit 129, the development processing unit 139 includes spin chucks 35 and cups 37. Further, as shown in FIG. 19, the development processing unit 139 includes two development nozzles 38 that discharge a development liquid and a moving mechanism 39 that moves the development nozzles 38 in the X direction.

In the development processing unit 139, the spin chuck 35 is rotated by a driving device (not shown), and one development nozzle 38 supplies the development liquid to each substrate W while being moved in the X direction. Thereafter, the other development nozzle 38 supplies the development liquid to each substrate W while being moved. In this case, the development processing for the substrate W is performed by the supply of the development liquid to the substrate W. Further, in the present embodiment, development liquids different from each other are discharged from the two development nozzles 38. Thus, two types of development liquids can be supplied to each substrate W.

In the cleaning drying processing section 161, cleaning drying processing chambers 81, 82, 83, 84 are provided in a stack. In each of the cleaning drying processing chambers 81 to 84, the substrate cleaning device 700 of FIG. 1 is provided. In the substrate cleaning device 700, the upper surface cleaning processing, the lower surface polishing processing, the lower surface cleaning processing and the drying processing for the substrate W on which the exposure processing has not been performed are performed.

The polishing cleaning controllers 780 of the plurality of substrate cleaning devices 700 provided in the cleaning drying processing section 161 may be provided in an upper portion of the cleaning drying processing section 161 as local controllers. Alternatively, the main controller 114 of FIG. 19 may perform each type of processing performed by the polishing cleaning controllers 780 of the plurality of substrate cleaning devices 700.

As shown in FIGS. 19 and 20, a fluid box 50 is provided in the coating processing section 121 to be adjacent to the coating development processing section 131. Similarly, a fluid box 60 is provided in the coating development processing section 131 to be adjacent to the cleaning drying processing block 14A. The fluid box 50 and the fluid box 60 each house fluid related elements such as a pipe, a joint, a valve, a flowmeter, a regulator, a pump, a temperature adjuster used to supply a processing liquid and a development liquid to the coating processing units 129 and the development processing units 139 and discharge the liquid and air and the like out of the coating processing units 129 and the development processing units 139.

(9) Configuration of Thermal Processing Sections

FIG. 21 is a schematic side view of the substrate processing apparatus 100 mainly showing the thermal processing sections 123, 133 and the cleaning drying processing section 162 of FIG. 19. As shown in FIG. 21, the thermal processing section 123 has an upper thermal processing section 301 provided above and a lower thermal processing section 302 provided below. A plurality of thermal processing devices PHP, a plurality of adhesion reinforcement processing units PAHP and a plurality of cooling units CP are provided in each of the upper thermal processing section 301 and the lower thermal processing section 302.

Heating processing for the substrate W is performed in each thermal processing device PHP. In each adhesion reinforcement processing unit PAHP, adhesion reinforcement processing for improving adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, the cooling processing for the substrate W is performed.

The thermal processing section 133 has an upper thermal processing section 303 provided above and a lower thermal processing section 304 provided below. A cooling unit CP, a plurality of thermal processing devices PHP and an edge exposure unit EEW are provided in each of the upper thermal processing section 303 and the lower thermal processing section 304.

In the edge exposure unit EEW, exposure processing (edge exposure processing) is performed on a region having a constant width at the peripheral portion of the resist film formed on the substrate W. In each of the upper thermal processing section 303 and the lower thermal processing section 304, each thermal processing device PHP provided to be adjacent to the cleaning drying processing block 14A is configured to be capable of receiving the substrate W carried in from the cleaning drying processing block 14A.

In the cleaning drying processing section 162, cleaning drying processing chambers 91, 92, 93, 94, 95 are provided in a stack. In each of the cleaning drying processing chambers 91 to 95, a cleaning drying processing unit SD2 is provided. Each cleaning drying processing unit SD2 has the same configuration as the substrate cleaning device 700 except that the substrate polishing mechanism 400 is not provided and the magnet plates 231A, 231B, 232A of FIG. 7 are integrally provided. In the cleaning drying processing unit SD2, the upper surface cleaning processing, the lower surface cleaning processing and the drying processing for the substrate W on which the exposure processing has been performed are performed.

(10) Configuration of Transport Sections

FIG. 22 is a side view mainly showing the transport sections 122, 132, 163 of FIG. 19. As shown in FIG. 22, the transport section 122 has an upper transport chamber 125 and a lower transport chamber 126. The transport section 132 has an upper transport chamber 135 and a lower transport chamber 136. The upper transport chamber 125 is provided with the transport device (transport robot) 127, and the lower transport chamber 126 is provided with the transport device 128. Further, the upper transport chamber 135 is provided with the transport device 137, and the lower transport chamber 136 is provided with the transport device 138.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling units P-CP are provided in the transport section 163 to be adjacent to the carry-in carry-out block 14B.

The transport device 127 is configured to be capable of transporting the substrates W among the substrate platforms PASS1, PASS2, PASS5, PASS6, the coating processing chambers 21, 22 (FIG. 20) and the upper thermal processing section 301 (FIG. 21). The transport device 128 is configured to be capable of transporting the substrates W among the substrate platforms PASS3, PASS4, PASS7, PASS8, the coating processing chambers 23, 24 (FIG. 20) and the lower thermal processing section 302 (FIG. 21).

The transport device 137 is configured to be capable of transporting the substrates W among the substrate platforms PASS5, PASS6, the placement buffer unit P-BF1, the development processing chamber 31 (FIG. 20), the coating processing chamber 32 (FIG. 20) and the upper thermal processing section 303 (FIG. 21). The transport device 138 is configured to be capable of transporting the substrates W among the substrate platforms PASS7, PASS8, the placement buffer unit P-BF2, the development processing chamber 33 (FIG. 20), the coating processing chamber 34 (FIG. 20) and the lower thermal processing section 304 (FIG. 21).

The transport device 141 (FIG. 19) of the transport section 163 is configured to be capable of transporting the substrate W among the placement cooling unit P-CP, the substrate platform PASS9, the placement buffer units P-BF1, P-BF2 and the cleaning drying processing section 161 (FIG. 20).

The transport device 142 (FIG. 19) of the transport section 163 is configured to be capable of transporting the substrate W among the placement cooling unit P-CP, the substrate platform PASS9, the placement buffer units P-BF1, P-BF2, the cleaning drying processing section 162 (FIG. 21), the upper thermal processing section 303 (FIG. 21) and the lower thermal processing section 304 (FIG. 21).

(11) Operation of Substrate Processing Apparatus

The operation of the substrate processing apparatus 100 will be described with reference to FIGS. 19 to 22. The carriers 113 in which the unprocessed substrates W are stored are placed on the carrier platforms 111 (FIG. 19) in the indexer block 11. The transport device 115 transports the unprocessed substrate W from the carrier 113 to each of the substrate platforms PASS1, PASS3 (FIG. 22). Further, the transport device 115 transports the processed substrate W that is placed on each of the substrate platforms PASS2, PASS4 (FIG. 22) to the carrier 113.

In the first processing block 12, the transport device 127 (FIG. 22) sequentially transports the substrate W placed on the substrate platform PASS1 to the adhesion reinforcement processing unit PAHP (FIG. 21), the cooling unit CP (FIG. 21) and the coating processing chamber 22 (FIG. 20). Next, the transport device 127 sequentially transports the substrate W on which the anti-reflection film is formed by the coating processing chamber 22 to the thermal processing device PHP (FIG. 21), the cooling unit CP (FIG. 21) and the coating processing chamber 21 (FIG. 20). Then, the transport device 127 sequentially transports the substrate Won which the resist film is formed by the coating processing chamber 21 to the thermal processing device PHP (FIG. 21) and the substrate platform PASS5 (FIG. 22).

In this case, the adhesion reinforcement processing is performed on the substrate W in the adhesion reinforcement processing unit PAHP, and then the substrate W is cooled to a temperature suitable for formation of the anti-reflection film in the cooling unit CP. Next, the anti-reflection film is formed on the substrate W by the coating processing unit 129 (FIG. 20) in the coating processing chamber 22. Subsequently, the thermal processing for the substrate W is performed in the thermal processing device PHP, and then the substrate W is cooled in the cooling unit CP to a temperature suitable for the formation of the resist film. Next, in the coating processing chamber 21, the resist film is formed on the substrate W by the coating processing unit 129 (FIG. 20). Thereafter, the thermal processing for the substrate W is performed in the thermal processing device PHP, and the substrate W is placed on the substrate platform PASS5.

Further, the transport device 127 transports the substrate W on which the development processing has been performed and which is placed on the substrate platform PASS6 (FIG. 22) to the substrate platform PASS2 (FIG. 22).

The transport device 128 (FIG. 22) sequentially transports the substrate W placed on the substrate platform PASS3 to the adhesion reinforcement processing unit PAHP (FIG. 21), the cooling unit CP (FIG. 21) and the coating processing chamber 24 (FIG. 20). Then, the transport device 128 sequentially transports the substrate W on which the anti-reflection film is formed by the coating processing chamber 24 to the thermal processing device PHP (FIG. 21), the cooling unit CP (FIG. 21) and the coating processing chamber 23 (FIG. 20). Subsequently, the transport device 128 sequentially transports the substrate W on which the resist film is formed by the coating processing chamber 23 to the thermal processing device PHP (FIG. 21) and the substrate platform PASS7 (FIG. 22).

Further, the transport device 128 (FIG. 22) transports the substrate W on which the development processing has been performed and which is placed on the substrate platform PASS8 (FIG. 22) to the substrate platform PASS4 (FIG. 22). The processing contents for the substrate Win each of the coating processing chambers 23, 24 (FIG. 20) and the lower thermal processing section 302 (FIG. 21) are similar to the processing contents for the substrate W in each of the coating processing chambers 21, 22 (FIG. 20) and the upper thermal processing section 301 (FIG. 21) that are described above.

In the second processing block 13, the transport device 137 (FIG. 22) sequentially transports the substrate W on which the resist film is formed and which is placed on the substrate platform PASS5 to the coating processing chamber 32 (FIG. 20), the thermal processing device PHP (FIG. 21), the edge exposure unit EEW (FIG. 21) and the placement buffer unit P-BF1 (FIG. 22). In this case, in the coating processing chamber 32, the resist cover film is formed on the substrate W by the coating processing unit 129 (FIG. 20). Thereafter, the thermal processing is performed on the substrate W in the thermal processing device PHP, and the substrate W is carried into the edge exposure unit EEW. Subsequently, in the edge exposure unit EEW, the edge exposure processing is performed on the substrate W. The substrate W on which the edge exposure processing has been performed is placed on the placement buffer unit P-BF1.

Further, the transport device 137 (FIG. 22) takes out the substrate W, on which the exposure processing has been performed by the exposure device 15 and on which the thermal processing has been performed, from the thermal processing device PHP (FIG. 21) that is adjacent to the cleaning drying processing block 14A. The transport device 137 sequentially transports the substrate W to the cooling unit CP (FIG. 21), the development processing chamber 31 (FIG. 20), the thermal processing device PHP (FIG. 21) and the substrate platform PASS6 (FIG. 22).

In this case, the substrate W is cooled to a temperature suitable for the development processing in the cooling unit CP. Then, the resist cover film is removed, and the development processing for the substrate W is performed, by the development processing unit 139 in the development processing chamber 31. Thereafter, the thermal processing for the substrate W is performed in the thermal processing device PHP, and the substrate W is placed on the substrate platform PASS6.

The transport device 138 (FIG. 22) sequentially transports the substrate W on which the resist film is formed and which is placed on the substrate platform PASS7 to the coating processing chamber 34 (FIG. 20), the thermal processing device PHP (FIG. 21), the edge exposure unit EEW (FIG. 21) and the placement buffer unit P-BF2 (FIG. 22).

Further, the transport device 138 (FIG. 22) takes out the substrate Won which the exposure processing has been performed by the exposure device 15 and the thermal processing have been performed from the thermal processing device PHP (FIG. 21) that is adjacent to the cleaning drying processing block 14A. The transport device 138 sequentially transports the substrate W to the cooling unit CP (FIG. 21), the development processing chamber 33 (FIG. 20), the thermal processing device PHP (FIG. 21) and the substrate platform PASS8 (FIG. 22). The processing contents for the substrate Win the development processing chamber 33, the coating processing chamber 34 and the lower thermal processing section 304 are similar to the processing contents for the substrate W in the development processing chamber 31, the coating processing chamber 32 (FIG. 20) and the upper thermal processing section 303 (FIG. 21) that are described above.

In the cleaning drying processing block 14A, the transport device 141 (FIG. 19) transports the substrate W that is placed on each of the placement buffer units P-BF1, P-BF2 (FIG. 22) to the substrate cleaning device 700 (FIG. 20) in the cleaning drying processing section 161. Then, the transport device 141 transports the substrate W from the substrate cleaning device 700 to the placement cooling unit P-CP (FIG. 22). In this case, polishing, cleaning and drying processing for the substrate W are performed in the substrate cleaning device 700, and then the substrate W is cooled in the placement cooling unit P-CP to a temperature suitable for the exposure processing in the exposure device 15 (FIG. 19).

The transport device 142 (FIG. 19) transports the substrate W on which the exposure processing has been performed and which is placed on the substrate platform PASS9 (FIG. 22) to the cleaning drying processing unit SD2 (FIG. 21) in the cleaning drying processing section 162. Further, the transport device 142 transports the substrate W on which the cleaning and drying processing have been performed to the thermal processing device PHP (FIG. 21) in the upper thermal processing section 303 or the thermal processing device PHP (FIG. 21) in the lower thermal processing section 304 from the cleaning drying processing unit SD2. In this thermal processing device PHP, post-exposure bake (PEB) processing is performed.

In the carry-in carry-out block 14B, the transport device 146 (FIG. 19) transports the substrate W on which the exposure processing has not been performed and which is placed on the placement cooling unit P-CP (FIG. 22) to the substrate inlet 15*a* (FIG. 19) of the exposure device 15. Further, the transport device 146 (FIG. 19) takes out the substrate W on which the exposure processing has been performed from the substrate outlet 15*b* (FIG. 19) of the exposure device 15, and transports the substrate W to the substrate platform PASS9 (FIG. 22).

In the case where the exposure device 15 cannot receive the substrate W, the substrate W on which the exposure processing has not been performed is temporarily stored in each of the placement buffer units P-BF1, P-BF2. Further, in the case where the development processing unit 139 (FIG. 20) in the second processing block 13 cannot receive the substrate W on which the exposure processing has been performed, the substrate W on which the exposure processing has been performed is temporarily stored in each of the placement buffer units P-BF1, P-BF2.

In the above-mentioned substrate processing apparatus 100, processing for the substrate W in the coating processing chambers 21, 22, 32, the development processing chamber 31 and the upper thermal processing sections 301, 303 that are provided above, and the processing for the substrate W in the coating processing chambers 23, 24, 34, the development processing chamber 33 and the lower thermal processing sections 302, 304 that are provided below can be concurrently performed. Thus, it is possible to improve throughput without increasing a footprint.

Here, the main surface of the substrate W refers to a surface on which the anti-reflection film, the resist film and the resist cover film are formed, and the back surface of the substrate W refers to a surface of the substrate Won the opposite side of the main surface. Inside of the substrate processing apparatus 100 according to the present embodiment, each type of the above-mentioned processing is performed on the substrate W with the main surface of the substrate W directed upward, that is, each type of processing is performed on the upper surface of the substrate W. Therefore, in the present embodiment, the main surface of the substrate W corresponds to the upper surface of the substrate of the present invention, and the back surface of the substrate W corresponds to the one surface and the lower surface of the substrate of the present invention.

(12) Effects (a) In the above-mentioned substrate cleaning device 700, the lower surface of the substrate W is polished by the polishing head ph and with the removing capacity corresponding to the position in the radial direction of the substrate W based on the distribution of contaminants of the lower surface of the substrate W.

In this case, the lower surface of the substrate W is polished by the polishing head ph, whereby contaminants firmly adhering to the lower surface of the substrate W are removed. Further, the capacity for removing contaminants by the polishing head ph is changed between a contaminated portion and an uncontaminated portion of the lower surface of the substrate W, whereby the contaminants can be removed while the lower surface of the substrate W is prevented from being non-uniformly polished. As a result, the lower surface of the substrate W can be clean and uniform.

(b) In the substrate cleaning device 700, the lower surface of the substrate W is polished by the polishing head ph of the substrate polishing mechanism 400, and then the lower surface of the substrate W is cleaned by the cleaning brush cb of the substrate cleaning mechanism 500. Thus, contaminants generated by the polishing of the lower surface of the substrate W are removed. Therefore, the lower surface of the substrate W can be more sufficiently cleaned.

(c) In the substrate processing apparatus 100, the lower surface of the substrate W on which the exposure processing has not been performed is polished and cleaned by the substrate cleaning device 700. Thus, the lower surface of the substrate Won which the exposure processing has not been performed can be clean and uniform. As a result, an occurrence of processing defects in the substrate W caused by contaminants on the lower surface of the substrate W is inhibited.

(13) Other Embodiments (a) While the substrate cleaning device 700 is configured to be capable of polishing the lower surface of the substrate W in the above-mentioned embodiment, the present invention is not limited to this. The substrate cleaning device 700 may be configured to be capable of polishing the upper surface of the substrate W. For example, the substrate cleaning device 700 may include a spin chuck that holds the lower surface of the substrate W by suction instead of the above-mentioned spin chuck 200, and a mover that moves the polishing head ph at least between the center and the outer peripheral end WE of the substrate W while bringing the polishing head ph into contact with the upper surface of the substrate W rotated by the spin chuck. In this case, the upper surface of the substrate W can be clean and uniform.

(b) In the above-mentioned embodiment, the polishing head ph of the substrate cleaning device 700 polishes the lower surface of the substrate W by being moved from the center WC to the outer peripheral end WE of the substrate W in the radial direction while being in contact with the lower surface of the substrate W. However, the present invention is not limited to this. The polishing head ph may polish the lower surface of the substrate W by being moved between the center WC and the outer peripheral end WE of the substrate W back and forth while being in contact with the lower surface of the substrate W. Alternatively, the polishing head ph may polish the lower surface of the substrate W by being moved from one end to the other end of the substrate W through the center WC of the substrate W while being in contact with the lower surface of the substrate W.

(c) While the polishing of the lower surface of the substrate W is controlled based on the removal information stored in the removal information storage 785 of FIG. 8 in the above-mentioned embodiment, the present invention is not limited to this. The information indicating the distribution of contaminants of the lower surface of the substrate W shown in FIG. 14 may be stored in the polishing cleaning controller 780 and the like instead of the removal information. Further, a table indicating a relationship between a degree of contamination and the removing capacity may be stored in the polishing cleaning controller 780. In this case, the polishing controller 790 or the spin chuck controller 781 of the polishing cleaning controller 780 may adjust the capacity for removing contaminants based on the distribution of contaminants and the above-mentioned table that are stored in advance such that the lower surface of the substrate W is clean and uniform.

As described above, in the case where the capacity for removing contaminants is adjusted based on the distribution of contaminants, a contamination detection device for detecting the actual distribution of contaminants of the lower surface of the substrate W may be provided in the substrate cleaning device 700. Thus, the capacity for removing contaminants can be adjusted based on the distribution of contaminants detected by the contamination detection device during the polishing of the lower surface of the substrate W.

The contamination detection device may include an imaging device capable of picking up images of at least part of the lower surface of the substrate W and a processing device capable of determining a degree of contamination from the image data acquired by the imaging device.

(d) While the substrate polishing mechanism 400 that polishes the lower surface of the substrate W and the substrate cleaning mechanism 500 that cleans the lower surface of the substrate W are provided in the substrate cleaning device 700 in the above-mentioned embodiment, the present invention is not limited to this. The substrate cleaning mechanism 500 does not have to be provided in the substrate cleaning device 700. In this case, the configuration of the substrate cleaning device 700 is simplified.

Alternatively, another substrate polishing mechanism 400 may be provided in the substrate cleaning device 700 instead of the substrate cleaning mechanism 500, that is, two substrate polishing mechanisms 400 may be provided in the substrate cleaning device 700. In this case, a plurality of polishing heads ph can be selectively used in a plurality of positions in the radial direction of the substrate W. Therefore, flexibility of a method of polishing the lower surface of the substrate W is improved.

In the case where the plurality of polishing mechanisms 400 are provided in the substrate cleaning device 700, the polishing heads ph of the plurality of polishing mechanisms 400 may be fabricated of the mutually same material or may be fabricated of mutually different materials.

As described above, in the case where the substrate cleaning mechanism 500 is not provided in the substrate cleaning device 700, the substrate cleaning device 700 and the cleaning drying processing unit SD2 may be provided in the cleaning drying processing section 161 of FIG. 19. Thus, the lower surface of the substrate W that has been polished by the substrate cleaning device 700 can be cleaned by the cleaning drying processing unit SD2 in the cleaning drying processing section 161.

(e) While pure water is used as the cleaning liquid in the above-mentioned embodiment, a chemical liquid such as BHF (Buffered Hydrofluoric Acid), DHF (Dilute Hydrofluoric Acid), Hydrofluoric Acid, Hydrochloric Acid, Sulfuric Acid, Nitric Acid, Phosphoric Acid, Acetic Acid, Oxalic Acid, Ammonia or the like may be used as the cleaning liquid instead of pure water. More specifically, a mixed solution of ammonia water and hydrogen peroxide water may be used as the cleaning liquid, and an alkaline solution such as TMAH (Tetramethylammonium hydroxide) may be used as the cleaning liquid.

(f) While the plurality of auxiliary pins 290 are provided in the spin chuck 200 of the substrate cleaning device 700 in the above-mentioned embodiment, the plurality of auxiliary pins 290 do not have to be provided. In this case, the number of components of the spin chuck 200 is reduced, and the configuration of the spin chuck 200 is simplified. Further, each chuck pin 220 is locally brought into the opened state in a region corresponding to the magnet plate 232A of FIG. 7, whereby the polishing head ph can be brought into contact with the outer peripheral end WE of the substrate W while the polishing head ph does not interfere with another member. Thus, the outer peripheral end WE (FIG. 5) of the substrate W can be polished. Further, each chuck pin 220 is locally brought into the opened state in a region corresponding to the magnet plate 232B of FIG. 7, whereby the cleaning brush cb can be brought into contact with the outer peripheral end WE of the substrate W while the cleaning brush cb does not interfere with another member. Thus, the outer peripheral end WE (FIG. 5) of the substrate W can be cleaned.

(g) While the exposure device 15 that performs the exposure processing for the substrate W by a liquid immersion method is provided as an external device of the substrate processing apparatus 100 in the above-mentioned embodiment, the present invention is not limited to this. The exposure device that performs the exposure processing for the substrate W with no liquid may be provided as an external device of the substrate processing apparatus 100. In this case, in the coating processing unit 129 in each of the coating processing chambers 32, 34, the resist cover film does not have to be formed on the substrate W. Therefore, the coating processing chambers 32, 34 can be used as development processing chambers.

(h) While the substrate processing apparatus 100 according to the above-mentioned embodiment is a substrate processing apparatus (so-called coater and developer) that performs the coating forming processing of the resist film and the development processing on the substrate W, the substrate processing apparatus provided with the substrate cleaning device 700 is not limited to the above-mentioned example. The substrate cleaning device 700 may be provided in a substrate processing apparatus that performs single processing such as cleaning processing on the substrate W. For example, the substrate processing apparatus according to the present invention may be constituted by an indexer block that includes a transport device, a substrate platform and the like, and one or a plurality of substrate cleaning devices 700.

(14) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the upper surface of the substrate W is an example of an upper surface of the substrate W, the lower surface of the substrate W is an example of one surface and a lower surface of the substrate W, the substrate cleaning device 700 is an example of a substrate cleaning device, the spin chuck 200 is an example of a rotation holder, the polishing head ph is an example of a polisher, the arm 410 and the arm support post 420 of the substrate polishing mechanism 400, and the inner configuration of the arm support post 420 are examples of a first mover, and the polishing cleaning controller 780 is an example of a controller.

Further, the rotation support shaft 414, the pulleys 415, 417, the belt 416 and the motor 418 that are provided inside of the arm 410 of the substrate polishing mechanism 400 are examples of a rotation driver, the cleaning brush cb of the substrate cleaning mechanism 500 is an example of a brush, the arm 510 and the arm support post 520 of the substrate cleaning mechanism 500, and the inner configuration of the arm support post 520 are examples of a second mover.

Further, the exposure device 15 is an example of an exposure device, the substrate processing apparatus 100 is an example of a substrate processing apparatus, the coating processing unit 129 that supplies the processing liquid for the resist film to the substrate W is an example of a coating device, and the transport devices 115, 127, 128, 137, 138, 141, 142, 146 are examples of a transport device.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for a cleaning device that cleans a lower surface of a substrate.

We claim:

1. A substrate cleaning method for removing contaminants from a lower surface of a substrate, comprising:

holding and rotating the substrate in a horizontal attitude;

moving a polisher at least between a center and an outer periphery of the substrate while bringing the polisher into contact with the lower surface of the substrate rotated by the rotating of the substrate, wherein a first region that includes the center of the substrate, a second annular region that surrounds the first region, a third annular region that surrounds the second annular region, and a fourth annular region that surrounds the third annular region and includes an outer peripheral end of the substrate are defined from the center of the substrate toward a radial direction of the substrate in the lower surface of the substrate rotated by the rotating of the substrate; and changing capacity for removing contaminants by the polisher such that the capacity for removing contaminants by the polisher at positions corresponding to the second and fourth annular regions is higher than the capacity for removing contaminants by the polisher at positions corresponding to the first region and the third annular region.

2. The substrate cleaning method according to claim 1, wherein the changing of capacity for removing contaminants by the polisher includes changing the capacity for removing contaminants by the polisher such that the capacity for removing contaminants by the polisher at the position corresponding to the fourth annular region is higher than the capacity for removing contaminants by the polisher at the position corresponding to the second annular region.

3. The substrate cleaning method according to claim 1, wherein the polisher includes abrasive grains, and the moving of a polisher between a center and an outer periphery of the substrate includes scraping contaminants adhering to the lower surface of the substrate while bringing the polisher into contact with the lower surface of the substrate.

4. The substrate cleaning method according to claim 1, comprising:

applying a photosensitive film to an upper surface of the substrate;

exposing the substrate to which the photosensitive film is applied; and removing the contaminants from the lower surface of the substrate by the substrate cleaning method according to claim 1 before the exposing of the substrate.

5. The substrate cleaning method according to claim 1, wherein the changing of capacity for removing contaminants by the polisher includes changing the capacity for removing contaminants by the polisher by changing a pushing force of the polisher against the lower surface of the substrate.

6. The substrate cleaning method according to claim 1, wherein the changing of capacity for removing contaminants by the polisher includes changing the capacity for removing contaminants by the polisher by changing a moving speed of the polisher between the center and the outer periphery of the substrate.

7. The substrate cleaning method according to claim 1, wherein the moving of a polisher between a center and an outer periphery of the substrate includes rotating the polisher while bringing the polisher into contact with the lower surface of the substrate, and the changing of capacity for removing contaminants by the polisher includes changing the capacity for removing contaminants by the polisher by changing a rotation speed of the polisher.

8. The substrate cleaning method according to claim 1, wherein the changing of capacity for removing contaminants by the polisher includes changing the capacity for removing contaminants by the polisher by changing a rotation speed of the substrate.

9. The substrate cleaning method according to claim 1, further comprising bringing a brush into contact with the lower surface of the rotated substrate after the polisher is moved while being in contact with the lower surface of the substrate.

10. A substrate processing method comprising:

applying a photosensitive film to an upper surface of a substrate;

cleaning a lower surface of the substrate on which the photosensitive film is formed by the substrate cleaning method according to claim 1; and exposing the substrate on which the photosensitive film is formed after the cleaning of a lower surface of the substrate.

* * * * *